United States Patent
Bonilla et al.

(10) Patent No.: US 7,749,892 B2
(45) Date of Patent: Jul. 6, 2010

(54) EMBEDDED NANO UV BLOCKING AND DIFFUSION BARRIER FOR IMPROVED RELIABILITY OF COPPER/ULTRA LOW K INTERLEVEL DIELECTRIC ELECTRONIC DEVICES

(75) Inventors: Griselda Bonilla, Fishkill, NY (US); Christos D. Dimitrakopoulos, Somers, NY (US); Son V. Nguyen, Yorktown Heights, NY (US); Alfred Grill, White Plains, NY (US); Satyanarayana V. Nitta, Poughquag, NY (US); Darryl D. Restaino, Modena, NY (US); Terry A. Spooner, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 704 days.

(21) Appl. No.: 11/564,358

(22) Filed: Nov. 29, 2006

(65) Prior Publication Data

US 2008/0122103 A1 May 29, 2008

(51) Int. Cl.
*H01L 21/4763* (2006.01)
(52) U.S. Cl. .................. 438/624; 438/622; 438/627; 438/687
(58) Field of Classification Search ............ 438/622, 438/624, 687, 627
See application file for complete search history.

(56) References Cited

U.S. PATENT DOCUMENTS

| | | | |
|---|---|---|---|
| 6,372,661 B1 | 4/2002 | Lin et al. | |
| 6,566,278 B1 | 5/2003 | Harvey et al. | |
| 6,576,545 B1 | 6/2003 | Hopper et al. | |
| 6,887,783 B2 | 5/2005 | Chen et al. | |
| 6,911,400 B2 | 6/2005 | Colburn et al. | |
| 7,081,673 B2 | 7/2006 | Hedrick et al. | |
| 2004/0063308 A1 | 4/2004 | Bao et al. | |
| 2004/0207084 A1 | 10/2004 | Hedrick et al. | |
| 2005/0022839 A1 | 2/2005 | Savas et al. | |
| 2005/0054194 A1 | 3/2005 | Tsai et al. | |
| 2005/0070116 A1 | 3/2005 | Fu et al. | |
| 2005/0077595 A1* | 4/2005 | Huang et al. | 257/532 |
| 2005/0093158 A1 | 5/2005 | Liu et al. | |
| 2005/0130435 A1 | 6/2005 | Annapragada et al. | |
| 2005/0238889 A1 | 10/2005 | Iwamoto et al. | |
| 2005/0245096 A1 | 11/2005 | Gates et al. | |
| 2005/0282382 A1 | 12/2005 | Ko et al. | |
| 2005/0287811 A1 | 12/2005 | Inukai | |
| 2006/0024955 A1 | 2/2006 | Frohberg et al. | |
| 2006/0046495 A1 | 3/2006 | Frohberg et al. | |
| 2006/0113672 A1* | 6/2006 | Wang et al. | 257/760 |
| 2007/0077779 A1* | 4/2007 | Rantala et al. | 438/778 |

* cited by examiner

*Primary Examiner*—Bradley K Smith
(74) *Attorney, Agent, or Firm*—Graham S. Jones; H. Daniel Schnurmann

(57) ABSTRACT

An interconnect in provided which comprises a copper conductor having both a top surface and a lower surface, with caps formed on the top surface of the metallic conductor. The cap is formed of dual laminations or multiple laminations of films with the laminated films including an Ultra-Violet (UV) blocking film and a diffusion barrier film. The diffusion barrier film and the UV blocking film may be separated by an intermediate film.

3 Claims, 21 Drawing Sheets

EFFECT OF UV CURE ON NBLOK PROPERTIES - SUMMARY

| Properties | NBLok POR | Nblok after UV cure |
|---|---|---|
| k at 150°C | 5.3 | 5.5 |
| 150°C Intrinsic Breakdown, MV/cm | 3.9 | 3.0 |
| Leakage at 1MV & 2 MV 150°C in A/cm² | 1.4 E$^{-8}$ @ 1MV<br>1.6 E$^{-6}$ @ 2MV | 2.3 E$^{-7}$ @ 1MV<br>2.8 E$^{-5}$ @ 2MV |
| Modulus, GPa (about 0.5 micron thick) | 106.8 | 166.6 |
| Stress, MPa | 415 – 500 (Compressive) | 480 – 560 (Tensile) |
| Density (XRR) | 2.04 | 2.06 |
| Oxidation Barrier | Pass | Pass |
| Adhesion to Cu (J/m²) | 6.54 (18s preclean) | 5.68 (18s preclean) |
| Barrier properties Cu dots – Leakage @ 2MV/1MV | 1.7 E$^{-6}$//1.4 E$^{-8}$ - Cu | 3.0 E$^{-5}$//2.4 E$^{-7}$ - Cu |

FIG. 6C

EMBEDDED NANO UV BLOCKING AND DIFFUSION BARRIER FOR IMPROVED RELIABILITY OF COPPER/ULTRA LOW K INTERLEVEL DIELECTRIC ELECTRONIC DEVICES

BACKGROUND OF THE INVENTION

The present invention relates to protection of the interconnection structures, known as interconnects, in Ultra-Large Scale Integrated (ULSI) microelectronic circuits including high speed microprocessors, application specific integrated circuits, memory storage devices, and related electronic structures with a multilayered barrier layer. More particularly this invention relates to the structure of cap layers for protecting interconnect-metallization in Back End Of Line (BEOL) structures in such ULSI microelectronic circuits.

In traditional semiconductor devices, aluminum and aluminum alloys have been used as interconnect metallurgies for providing electrical connections to and from devices in BEOL layers of the devices. While aluminum-based metallurgies have been the material of choice for use as metal interconnects in the past, aluminum no longer satisfies requirements as circuit density and speeds for semiconductor devices increase and the scale of devices decreases. Thus, copper is being employed as a replacement for aluminum, because of its lower susceptibility to electromigration failure as compared to aluminum and its lower resistivity.

Despite these advantages, there is the significant problem that copper diffuses readily into the surrounding dielectric material as processing steps continue. To inhibit the copper diffusion, copper interconnects can be isolated by employing protective barrier layers. Such barrier layers include conductive, diffusion barrier liner of tantalum, titanium, or tungsten, in pure or alloy form, along the sidewalls and bottom of the copper interconnection. On the top surface of the copper interconnects caps are provided. Such caps have comprised various dielectric materials, e.g. silicon nitride ($Si_3N_4$) "nitride."

A conventional BEOL interconnect utilizing copper metallization and cap layers described above includes a lower substrate which may contain logic circuit elements such as transistors. An Inter-Level Dielectric (ILD) layer overlies the substrate. The ILD layer may be formed of silicon dioxide ($SiO_2$). However, in advanced interconnects, the ILD layer is preferably a low-k polymeric thermoset material. An adhesion promoter layer may be disposed between the substrate and the ILD layer. A silicon nitride ($Si_3N_4$) "nitride" layer is optionally disposed on ILD layer. The nitride layer is commonly known as a hardmask layer or polish stop layer. At least one conductor is embedded in the ILD layer. The conductor is preferably copper in advanced interconnects, but alternatively may be aluminum or other conductive material. When the conductor is copper, a diffusion barrier liner is preferably disposed between the ILD layer and the copper conductor. The diffusion barrier liner is typically comprised of tantalum, titanium, tungsten, or nitrides of these metals.

The top surface of the conductor is made coplanar with the top surface of the hard mask nitride layer, usually by a chemical-mechanical polish (CMP) step. A cap layer, also typically of nitride, is disposed on the conductor and the hard mask nitride layer. The cap layer acts as a diffusion barrier to prevent diffusion of copper from the conductor into the surrounding dielectric material during subsequent processing steps. High Density Plasma (HDP) Chemical Vapor Deposition (CVD) films such as nitride provide superior electromigration protection, as compared to Plasma Enhanced (PE) CVD films, because HDP CVD films more readily stop the movement of copper atoms along the interconnect surface in the cap layer.

However there is the problem that in a conventional HDP deposition process, a seam is formed in the HDP CVD cap layer, and a crack in the cap layer often develops at this seam due to stress within the structure. If the crack develops in a portion of the cap layer overlying a copper conductor, the copper conductor may be readily exposed to moisture and other sources of oxygen. If the crack develops in a portion of the cap layer overlying the ILD, the copper conductor may be exposed to moisture diffusing through the ILD. In the latter case, the seam is of relatively minor concern in interconnects utilizing silicon dioxide as the ILD material, because the rate of moisture diffusion through silicon dioxide is very low. However, in interconnects utilizing a low-k polymeric thermoset dielectric material, this seam is of greater concern, because the rate of diffusion of moisture through most spin-on and CVD low-k materials is relatively high. Moreover, any crack in the cap layer may lead to copper diffusion into the ILD through the seam leading to formation of a copper nodule under the cap layer. Such a copper nodule may lead to short circuits due to leakage of current between adjacent interconnect lines.

Another significant disadvantage occurs when HDP CVD films are integrated with low-k dielectric materials. The energetic reactions of an HDP CVD process can enable interaction with and within the low-k materials causing undesirable changes to occur. Such changes in low-k dielectric materials can be significantly mitigated by the use of PE CVD films. Moreover, in typical PE CVD films, no seam is formed during the deposition process. For this reason, PE CVD cap layers have been used to cap copper interconnects in earlier ground-rule devices. In more advanced ground-rule devices, PE CVD films have been found to be inferior to cap layers formed by other deposition techniques such as HDP CVD because of poor adhesion to the copper surface. PE CVD films may delaminate and form blisters over patterned copper lines, particularly during subsequent dielectric depositions, metallization, and chemical-mechanical polishing.

After being deposited onto copper metallurgy, additional insulating layers generally will be deposited over the cap layer. However, subsequent deposition of insulating layers onto the cap layer will produce stress which can cause the cap layer to peel from the copper surface. This delamination results in several catastrophic failure mechanisms, including lifting interlayer dielectrics, lifting copper conductors, copper diffusion from uncapped copper lines, and electromigration. Such results are generally seen in dual damascene processing where delamination of the silicon nitride hardmask layer generally occurs during copper chemical-mechanical polishing.

Commonly assigned U.S. Pat. No. 6,887,783 Chen et al. entitled "Bilayer HDP CVD/PE CVD Cap in Advanced BEOL Interconnect Structures and Method Thereof" describes a Back-End-Of-Line (BEOL) metallization structure including a bilayer diffusion barrier or cap, with a first cap layer formed of a dielectric material preferably deposited by a high density plasma chemical vapor deposition (HDP CVD) process, and with a second cap layer formed of a dielectric material preferably deposited by a plasma-enhanced chemical vapor deposition (PE CVD) process. The bilayer diffusion barrier or cap is adapted for use with interconnects comprising low-k dielectric material for the interlayer dielectric (ILD) and copper for the conductors.

Commonly assigned U.S. Pat. No. 7,081,673 Hedrick et al. "Multilayered Cap Barrier in Microelectronic Interconnect Structures" describes a low-k multilayered dielectric diffusion barrier having at least one low-k sublayer and at least one air barrier sublayer. The multilayered dielectric diffusion barrier layer provides a metal diffusion barrier as well as an air permeation barrier. The low-k multilayered dielectric diffusion barrier layer is provided to gain in chip performance through a reduction in capacitance between conducting metal features and an increase in reliability, because the multilayered dielectric diffusion barrier layer is impermeable to air and prevents metal diffusion.

FIG. 1 shows a prior art example from Hedrick et al. of an interconnect 40A, with multiple levels 1000, with each level 1000 including both a via level 1100 and a line level 1200. The interconnect 40A contains conducting metal features 33 that traverse through the structure and may have interfaces with a diffusion barrier liner 34 composed of metal. The conducting metal features 33 and diffusion barrier liner 34 are surrounded by dielectric layers. The dielectric layers in the via level include a low dielectric constant layer 32 and a multilayered-dielectric-diffusion-capping-barrier layer 39 that is comprised of at least two sublayers, an air barrier sublayer 36 and a low-k sublayer 38. In the line level 1200, the dielectric layers include a low dielectric constant layer 31 and an optional hardmask dielectric 41. Optionally, a dielectric etch stop layer 37 may be placed between the low dielectric constant layers in via level dielectric layer 32 and line level dielectric layer 31. The low dielectric constant material in the via level dielectric layer 32 and line level dielectric layer 31 may be identical or may differ in chemical composition.

FIG. 2 shows another a prior art example from Hedrick et al. of an interconnect 40B with multiple levels 1000, with each level 1000 including both a via level 1100 and line level 1200. The interconnect 40 of FIG. 2 contains conducting metal features 33 that traverse through the structure and may have interfaces with a diffusion barrier liner 34. The conducting metal features 33 and diffusion barrier liner 34 are surrounded by dielectric layers. The dielectric layers in the via level include the inventive multilayered-dielectric-diffusion-capping-barrier layer 39 that comprised of at least two sublayers including air barrier sublayer 36 and low-k sublayer 38. The dielectric layers in the line level include a low dielectric constant layer 31 and optional hardmask dielectric layer 41. Optionally, a dielectric etch stop layer 37 may be placed between low dielectric constant layers 31 and multilayered-dielectric-diffusion-capping-barrier layer 39.

FIG. 3 shows yet another prior art example from Hedrick et al. of an interconnect 40C, with multiple levels 1000, with each level 1000 including both a via level 1100 and line level 1200. The interconnect 40C contains conducting metal features 33 that traverse through the structure and may have interfaces with a diffusion barrier liner 34. The conducting metal features 33 and diffusion barrier liner 34 are surrounded by several dielectric layers. The dielectric layers in the line level include a low dielectric constant material 43. The dielectric layers in the via level include the identical low dielectric constant material 43 in regions not directly underlying conducting metal lines, a chemically different low dielectric constant material 42 which is present under conducting metal lines 33, and a multilayered-dielectric-diffusion-capping-barrier layer 39. Optionally, a dielectric etch stop layer 37 may be placed between the low dielectric constant material 42 and the diffusion barrier liner 34 thereabove.

US patent Application 2006/0113672 of Wang et al. entitled "Improved HDP-Based ILD Capping Layer" teaches that the upper surface of any Cu conductor (typically a wire, as vias are in contact with a bottom surface of an overlying conductor) must be protected from harm by processes such as oxidation. Wang et al. states that "to cap the upper surface of the copper interconnection, a 'capping layer' of a dielectric material such as silicon nitride ($Si_3N_4$) is typically employed. The capping layer is also referred to as a 'passivation layer'. Often the passivation layer must also function as an etch stop layer during subsequent processing, however materials which perform best as etch stop layers often do not perform best as passivation layers. For example, silicon oxynitride, SiON, is useful as an etch stop layer but it is less desirable as a passivation layer because of delamination which can occur between copper and silicon oxynitride. Silicon nitride, 'SiN', avoids the delamination problem, and is a preferred passivation material, but is less desirable as an etch stop layer." Wang et al also states as follows: "A cap nitride stack which prevents etch penetration to the HDP nitride while maintaining the electromigration benefits of HDP nitride atop Cu. In one embodiment, the stack comprises a first layer of HDP nitride and a second layer of a Si—C—H compound disposed over the first layer. The Si—C—H compound is for example BLoK, or N-BLoK (Si—C—H—N), and is selected from a group of materials that has high selectivity during via RIE such that RIE chemistry from the next wiring level does not punch through. Carbon and nitrogen are the key elements. In another embodiment, the stack comprises a first layer of an HDP nitride, followed by a second layer of UVN (a plasma nitride), and a third layer comprising HDP nitride disposed over the second layer."

Wang et al describes a problem with a bilayer of a UVN/HDP nitride capping layer formed by an UVN film and an HDP nitride film, which is that in forming a via hole, the Reactive Ion Etching (RIE) process continues too deep and punches through the UVN film and lands on the HDP film. If the UVN is completely missing under a via hole, the via RIE will reach down to the HDP nitride film, which results in problems. A seam in the HDP nitride can become an ingress path for copper (Cu) to react with moisture, which leads to volume expansion and rupture of the capping layer. Also, there is a possible reaction during via RIE through the seam.

Wang et al. suggest that the problem of poor selectivity between UVN and silicon dioxide ($SiO_2$) can be solved by using N-BLoK (or BLoK) instead of UVN in the capping layer, over the HDP nitride layer. BLoK is a Si—C—H compound made by Applied Materials Tool. N-BLoK is the Si—C—H—N compound made by Applied Materials Tool. Since N-BLoK is mostly Si—C—H—N, the selectivity between $SiO_2$ and N-BLoK (or BLoK) is large and the via RIE process would stop on the N-BLoK (or BLoK) without risking damage to the HDP capping layer. BLoK and N-BLoK are referred to as silicon carbide and silicon carbonitrides (nitrogen doped silicon carbide), respectively.

Wang et al teaches that it is important to have HDP nitride as the lower layer on the embedded copper conductor to provide a good interface between Cu and the nitride capping layer. Therefore HDP nitride is the preferred material to be used for the lower layer in a multi-layer capping layer. A subsequent layer(s) can be N-BLoK over the HDP first layer, or HDP over UVN over the HDP first layer, or HDP over N-BLoK over the HDP layer, to solve the selectivity issue during the via oxide RIE.

FIG. 4A depicts a Wang et al. prior art interconnect 500, elevational, cross-section, containing two wiring levels 510 and 530. A copper conductor 520 is shown embedded in a trench in a first ILD layer 512. A barrier layer 518 is provided under and on the side wall of the copper conductor 520. The top surface of the copper conductor 520 is essentially coplanar with the surface of the ILD 512, typically as a result of Chemical Mechanical Polishing (CMP). A capping layer 522 is deposited over the device 500 covering the top surface of the ILD 512 and the top surface of the copper conductor 520. A second ILD layer 532 is formed over the capping layer 522, and a via hole 536 (is formed in the second ILD layer 532. In FIG. 4B, the ILD layers 512 and 532 may both be silicon dioxide ($SiO_2$.) However, a suitable low-k material was described as being acceptable. In the interconnect 500, the second capping layer 526) of the overall capping layer 522 comprises N-BLoK (or BLoK.)

FIG. 4B depicts another Wang et al. prior art interconnect 600, elevational, cross-section, containing two wiring levels 610 and 630. A copper conductor 620 is shown which is embedded in a trench in a first ILD layer 612. A barrier layer 618 is provided under and on the side wall of the copper conductor 620. The top surface of the copper conductor 620 is essentially coplanar with the surface of the ILD 512, typically as a result of Chemical Mechanical Polishing (CMP). A capping layer 622 is deposited over the device 600 covering the top surface of the ILD 612 and the top surface of the copper conductor 620. A second ILD layer 632 is formed over the capping layer 622, and a via hole 636 is formed in the second ILD layer 632. of the ILD 612 and the copper conductor 620. The interconnect structure 600 of FIG. 4B is different from the interconnect structure 500 of FIG. 4A in that the multilayer capping layer 622 comprises three layers, rather than two layers. More particularly, a layer 626 of UVN 626 (a plasma nitride) is deposited over an initial layer 624 of HDP nitride (HDP-1). Then, a second layer 628 of HDP nitride (HDP-2) is deposited over the layer 626 of UVN. The first layer 624 of HDP nitride (HDP-1) is on the surface of the ILD 612 and the copper conductor 620.

U.S. patent Application 2006/0024955 of Frohberg et al. entitled "Nitrogen-Free ARC/Capping Layer and Method of Manufacturing the Same" describes a "nitrogen-free ARC/capping layer in a low-k layer stack, which, in particular embodiments, is comprised of carbon-containing silicon dioxide, wherein the optical characteristics are tuned to conform to the 193 nm lithography. Moreover, the ARC/capping layer is directly formed on the low-k material, thereby also preserving the integrity thereof during an etch and chemical mechanical polishing process." The Frohberg et al. application 2006/0024955 provides for capping dielectric (as a hard mask), but it is not related to capping which provides a Cu barrier layer.

U.S. patent Application 2006/0046495 of Frohberg et al. entitled "Technique for Enhancing the Fill Capabilities in an Electrochemical Deposition Process by Edge Rounding of Trenches" describes that "During the formation of a metal line in a low-k dielectric material, an upper portion of a trench formed in a capping layer and the low-k dielectric material is treated to provide enlarged tapering or corner rounding, thereby significantly improving the fill capabilities of subsequent metal deposition processes. In one particular embodiment, an additional etch process is performed after etching through the capping layer and the low-k dielectric layer and after resist removal." The Frohberg et al. application 2006/0046495 also provides for capping dielectric (as a hard mask), and it also is not related to capping which provides a Cu barrier layer.

The utilization of materials that serve as metal diffusion barriers in metal interconnects, that are part of Ultra-Large Scale Integrated (ULSI) circuits and microelectronic devices, is typically required to generate reliable devices since low-k InterLayer Dielectrics (ILDs) do not prevent metal diffusion. The placement of such metal diffusion barrier materials in an interconnect can differ and the quality of the film will depend on the deposition and processing methods.

Commonly assigned U.S. Pat. No. 6,911,400 of Colburn et al. entitled "Nonlithographic Method to Produce Self-Aligned Mask, Articles Produced by Same and Compositions for Same" shows an interconnect with an InterLayer Dielectric (ILD), metal wiring, a liner barrier layer, and cap barrier layer. The interconnect has multiple levels comprised of multiple wiring levels, a via layer and a line level. Colburn et al. indicates that materials for the ILD have low dielectric constants (k<3) including carbon-doped silicon dioxide (silicon oxycarbide or SiCOH dielectrics); fluorine-doped silicon oxide (FluoroSilicate Glass (FSG)); spin-on glasses; SilSes-Quioxanes (SSQs), including Hydrogen SSQ (HSSQ), Methyl SSQ (MSSQ) and mixtures or copolymers of HSSQ and MSSQ; and any silicon-containing low-k dielectric. The ILD may contain pores to further reduce the dielectric constant, and other dielectrics may be used. Alternatively the structure which includes the metal wiring, liner barrier layer, and cap barrier layer is modified to include multiple ILD layers with dielectric hardmask layers therebetween. The materials for the ILD have low dielectric constants (k<3), e.g. an organic polymer thermoset, and may be selected from the group SiLK™, (a product of Dow Chemical Co.), Flare™ (a product of Honeywell), and other polyarylene ethers, or other organic polymer thermoset dielectrics. Materials for the dielectric hardmask include silicon carbides, carbon-doped silicon dioxide (silicon oxycarbide or SiCOH dielectrics); fluorine-doped silicon oxide (FSG); spin-on glasses; and SSQs.

Diffusion barrier layers comprised of dielectrics including, for example, silicon nitrides, silicon carbides, and silicon carbonitrides, are commonly used in microelectronic devices. These materials are normally deposited by Chemical Vapor Deposition (CVD) and PE CVD methods and can be deposited as continuous films. Unlike metal barrier layers, dielectric layers can be deposited as blanket films and can be placed between conducting metal lines.

In various prior art structures, thin wires, (and optionally fat wires) are formed in a low dielectric constant (k) material having a dielectric constant between about 3 and about 3.5. In other prior art structures, thin wires (and optionally the fat wires) are formed in an Ultra Low K (ULK) material, where K is the dielectric constant, having a dielectric constant less than 3 and potentially as low as 1.8. Typically, the ULK materials have dielectric constants within a range from 1.8 to 3.

Use of ultraviolet (UV) light to modify the bulk of a SiCOH dielectric film is well known. As is known in the art, UV radiation may be used to penetrate into a dielectric of the SiCOH composition to strengthen the bulk of the dielectric to raise the elastic modulus. For example, U.S. Pat. No. 6,566,278 to Harvey teaches the use of UV light to make the bulk of a SiCOH film denser. Specifically, the '278 patent teaches the conversion of Si—OH groups in the bulk of the film into Si—O—Si linkages. The resulting film disclosed in the '278 patent has "bonds characteristic of an ordered silicon oxide lattice" after UV irradiation. To accomplish this, the UV radiation breaks Si—O and O—H bonds and causes formation of more $Si(O)_3$ and $Si(O)_4$ structures (with 3 or 4 bonds to Si, respectively) and these render the material stronger and with a higher elastic modulus.

However, while UV cure has been proven to be beneficial for ultra low-k ILD/IMD (Inter Metal Dielectric) integration, UV cure also increases/changes the stress of the underlying cap layer (i.e., N-Blok/Nitride) such that it changes from a compressive to a highly tensile film. The observed change in stress increases the dielectric (k) value of the cap layer and adversely impacts the mechanical integrity of the structure.

A known solution to the effect of UV cure is to compensate for the change in stress by starting with a highly compressive N-Blok film. Consequently, this change will likely increase the dielectric constant, k, and impact its Cu oxidation/diffusion properties. The dielectric (k) value of the cap layer must be reduced for high performance sub-50 nm nano-CMOS devices. Bilayer caps with an embedded nano-Blocking UV film will minimize the stress change, while maintaining a reduced total capacitance of the structure.

SUMMARY OF THE INVENTION

The present invention relates to interconnects including a multiple film-diffusion-capping-barrier layer that serves as a barrier to metal diffusion and air permeation, and is resistant to UV cure modification. The multilayered-dielectric-diffusion-capping-barrier layer of the present invention is comprised of sublayers where at least one layer acts as a UV blocking layer that will enable the integration of Cu/Ultra low k InterLayer Dielectric (ILD) applied by PECVD, spun on, interconnects requiring post UV processing.

In addition to its barrier properties to metal diffusion and air permeation, the barrier layers of this invention also prevent/inhibit UltraViolet (UV) light/E-Beam from penetration into the substrate and/or bottom-most layer of a cap barrier layer.

More particularly, the present invention relates to the use of multilayered cap barrier layer in Back End Of The Line (BEOL).

The present invention also relates to the use of a UV resistant, multilayered cap barrier material in an electronic device containing at least two conductors or an electronic sensing structure.

A primary advantage of the present invention is the prevention of UV/e-beam modification to cap layers by embedding a dielectric blocking layer within the cap barrier film. Methods for the utilization, compositions of matter, and structures that implement the barrier films are also described.

The present invention can be used in any microelectronic device that uses metal interconnects including, for example, high speed microprocessors, application specific integrated circuits, and memory storage. Use of a multilayered dielectric diffusion barrier layer of the present invention is extremely advantageous for use with integrated circuits that use low-k dielectrics that require UV cure.

In an embodiment of this invention, an interconnect includes the multi-film dielectric diffusion barrier layer comprised of two or more sub-films that exhibit minimal change in material and electronic properties with UV cure. At least one sub-film is a material having a high C content with a high optical bandgap, which can block UV from modifying the desired properties of the cap layer. At least another of these sub-films may be a CVD deposited film that is impermeable to air and a metal diffusion barrier. The UV blocking film can be placed atop and/or below, and/or in between laminated barrier films. Optionally, adhesion layers may be applied at any of the interfaces in the multi-film dielectric diffusion layer or at interfaces between the sublayers.

The multilayered dielectric diffusion barrier layer of the present invention can have a tunable dielectric constant, depending on the thickness of the embedded layer (2 to 10 nm). Composite dielectric constant values can range from (3<k<7), while maintaining the required metal diffusion and air barrier properties, and minimizing stress change by UV cure. In addition, the multilayered dielectric diffusion barrier is thermally stable to temperatures greater than 400° C. and can be dense (i.e., non-porous) or porous to further reduce the dielectric constant.

In a second embodiment of the present invention, a method for producing the multilayered dielectric diffusion barrier layer is described. The multilayered dielectric diffusion barrier layer of the present invention is generated atop an interconnect having exposed metal and dielectric features. Each sublayer is then deposited by either CVD related approaches, or by solvent based processes (e.g., spin coating). Optionally, adhesion promoters are applied at any interface of the multilayered dielectric diffusion barrier layer or at interfaces between the sublayers.

In a third embodiment of the present invention, compositions of the multilayered dielectric diffusion barrier layer and its sublayers are provided. At least one sublayer is produced by a CVD based process whereby the air and metal diffusion barrier sublayer is comprised of silicon nitride, silicon carbonitride, or a dielectric with the general composition of $Si_tN_uC_vO_wH_x$, where $0.1 \leq t \leq 0.8$, $0 \leq u \leq 0.8$, $0.05 \leq v \leq 0.8$, $0 \leq w \leq 0.3$, $0.05 \leq x \leq 0.8$ for $t+u+v+w+x=1$. At least one other sublayer is produced by a CVD based process whereby the sublayer is comprised of UV blocking high band gap films such as boronitride, silicon boronitride, carbon boronitride, silicon carbon boronitride, and carbon films, or lower band gap films with better mechanical, electrical, and Cu diffusion properties such as nitrided carbon ($CN_x$) and boron doped nitrided carbon ($CB_xN_y$).

In accordance with this invention, an interconnect is provided comprising a metallic conductor having both a top surface and a lower surface, and a cap formed on the top surface of the metallic conductor with the cap being formed of laminated films with the laminated films including an UltraViolet (UV) blocking film and a diffusion barrier film. Preferably, the diffusion barrier film is formed on the top surface of the metallic conductor; the metallic conductor consists essentially of copper; and the UV blocking film is formed over the diffusion barrier film.

Preferably, an intermediate film is formed between the diffusion barrier film and the UV blocking film, with the intermediate film being composed of a material selected from an adhesion film and a graded film. It is preferred that the adhesion film is selected from the group consisting of $Si_aL_bR_c$ and $a+b+c=1$; where "L" is selected from the group consisting of hydroxyl, methoxy, ethoxy, acetoxy, alkoxy, carboxy, amines, halogens; "R" is selected from the group consisting of hydride, methyl, ethyl, vinyl, and phenyl (any alkyl or aryl); "a" is from about 0.25 to about 0.5, "b" is from about 0.1 to about 0.8, and "c" is from about 0 to about 0.7.

Preferably, the UV blocking film is formed over the top surface of the metallic conductor; and the diffusion barrier film is formed on the UV blocking film; the diffusion barrier film is formed on the top surface of the metallic conductor; the UV blocking film is formed over the diffusion barrier film; and a second diffusion barrier film is formed on the UV blocking film.

It is preferred that the diffusion barrier film is formed on the top surface of the metallic conductor; the UV blocking film is formed over the diffusion barrier film; at least a second diffusion barrier film is formed on the UV blocking film; and at least a second UV blocking film is formed over the second diffusion barrier film. The interconnect may include the UV blocking film formed on the top surface of the metallic conductor; the diffusion barrier film formed over the UV blocking film; and a second UV blocking film formed on the diffusion barrier film.

The UV blocking film may comprise a UV blocking high band gap film selected from the group consisting of nitrided carbon (CNx), boronitride, silicon boronitride, carbon boronitride, silicon carbon boronitride, and silicon carbon films adapted to be deposited in a Chemical Vapor Deposition (CVD) chamber, and films with lower band gap, but better mechanical, electrical, and Cu diffusion properties nitrided carbon ($CN_x$) and boron doped nitrided carbon ($CB_xN_y$).

In another aspect of this invention, an interconnect, comprises a first dielectric film with a recess having a recess bottom and recess sidewall; a lower diffusion barrier film formed on the recess bottom and on the recess sidewall; a metallic conductor having a side surface; a lower surface and a top surface with the side surface and the lower surface being in contact with the lower diffusion barrier; a cap formed on the top surface of the metallic conductor with the cap being formed of laminated films with the laminated films including an Ultra-Violet (UV) blocking film and a diffusion barrier film. Preferably, the diffusion barrier film is formed on the top surface of the metallic conductor; the metallic conductor consists essentially of copper; and the UV blocking film is formed over the diffusion barrier film. It is preferred that an intermediate film is formed between the diffusion barrier film and the UV blocking film, with the intermediate film being composed of a material selected from an adhesion film and a graded film. Preferably, the adhesion film is selected from the group consisting of $Si_aL_bR_c$ and $a+b+c=1$; where "L" is selected from the group consisting of hydroxyl, methoxy, ethoxy, acetoxy, alkoxy, carboxy, amines, halogens; "R" is selected from the group consisting of hydride, methyl, ethyl, vinyl, and phenyl (any alkyl or aryl); "a" is from about 0.25 to about 0.5, "b" is from about 0.1 to about 0.8; and "c" is from about 0 to about 0.7. It is also preferred that the UV blocking film is formed over the top surface of the metallic conductor; and the diffusion barrier film is formed on the UV blocking film. Preferably, the diffusion barrier film is formed on the top surface of the metallic conductor; the UV blocking film is formed over the diffusion barrier film; and a second diffusion barrier film is formed on the UV blocking film. Preferably, the diffusion barrier film is formed on the top surface of the metallic conductor; the UV blocking film is formed over the diffusion barrier film; at least a second diffusion barrier film is formed on the UV blocking film; and at least a second UV blocking film is formed over the second diffusion barrier film. It is also preferred that the UV blocking film is formed on the top surface of the metallic conductor; the diffusion barrier film is formed over the UV blocking film; and a second UV blocking film is formed on the diffusion barrier film. Preferably, the UV blocking film comprises a UV blocking high band gap film selected from the group consisting of nitrided carbon (CNx), boronitride, silicon boronitride, carbon boronitride, silicon carbon boronitride, and silicon carbon films adapted to be deposited in a Chemical Vapor Deposition (CVD) chamber, and films with lower band gap, but better mechanical, electrical, and Cu diffusion properties nitrided carbon ($CN_x$) and boron doped nitrided carbon ($CB_xN_y$).

In accordance with still another aspect of this invention, an interconnect, comprises a first dielectric film with a recess having a recess bottom and recess sidewall; a lower diffusion barrier film formed on the recess bottom and on the recess sidewall; a copper conductor having a side surface; a lower surface and a top surface with the side surface and the lower surface being in contact with the lower diffusion barrier; a cap formed on the top surface of the metallic conductor with the cap being formed of laminated films with the laminated films including an Ultra-Violet (UV) blocking film and a diffusion barrier film; and a conductive copper via connected to the copper conductor.

A further aspect of this invention comprises a method of forming an interconnect, comprising providing a metallic conductor having both a top surface and a lower surface, and forming a cap on the top surface of the metallic conductor with the cap comprising laminated films with the laminated films including an Ultra-Violet (UV) blocking film and a diffusion barrier film.

BRIEF DESCRIPTION OF THE DRAWINGS

FIG. 6C is a table which shows the effect of UV cure on Nblok properties.

DETAILED DESCRIPTION OF THE INVENTION

In one embodiment of the present invention, a multilayered diffusion barrier layer is thermally stable above 300° C., has a thickness between 10 nm and 50 nm, and is comprised of at least two laminated films, i.e. a dual film (bilayer), where at least one film is an air and metal diffusion barrier and at least another of the dual films is a UV blocking film. The multi-film diffusion barrier layer of the present invention may have a variety of configurations including, for example, dual films with the UV blocking film atop the laminated cap barrier, dual films with the cap barrier film atop the UV blocking film, or a triple film (three laminated films or which may be referred to as a trilayer) with the UV blocking film placed between two cap barrier films. For example, (a) if the objective is to prevent UV penetration, the UV blocking film is deposited on top; (b) if the objective is to allow partial UV penetration, the film is inserted in middle of a triple film; and (c) if the objective is to allow the top film to be exposed to UV/e-Beam, the UV Blocking film is put on the bottom to prevent UV penetration into the substrate.

Figure 1:
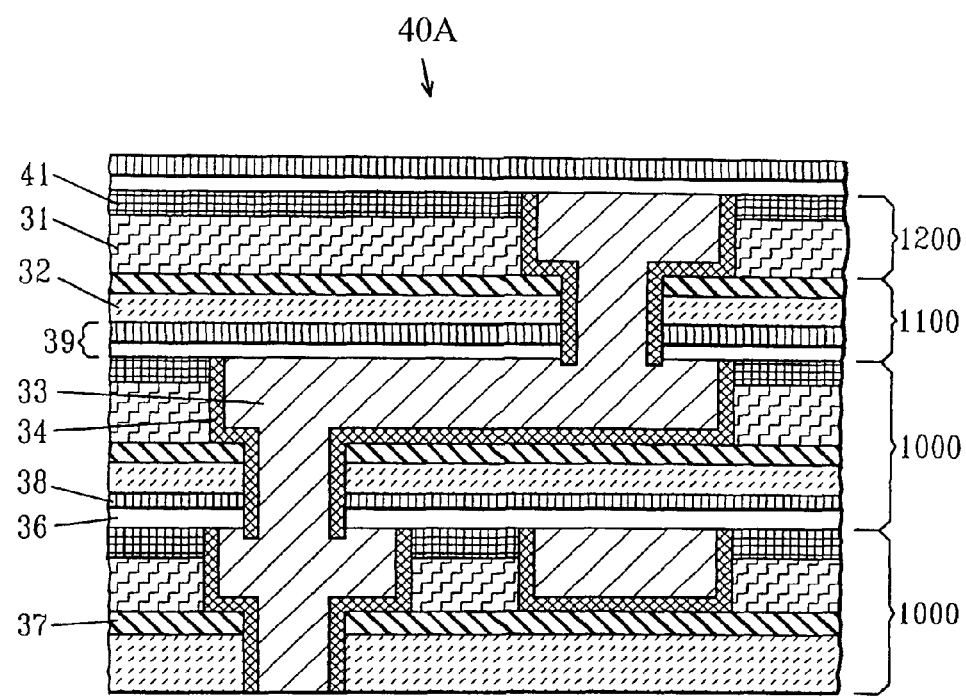
FIG. 1 shows a prior art example of an interconnect with multiple levels with each level including both a via level and a line level.
Figure 2:
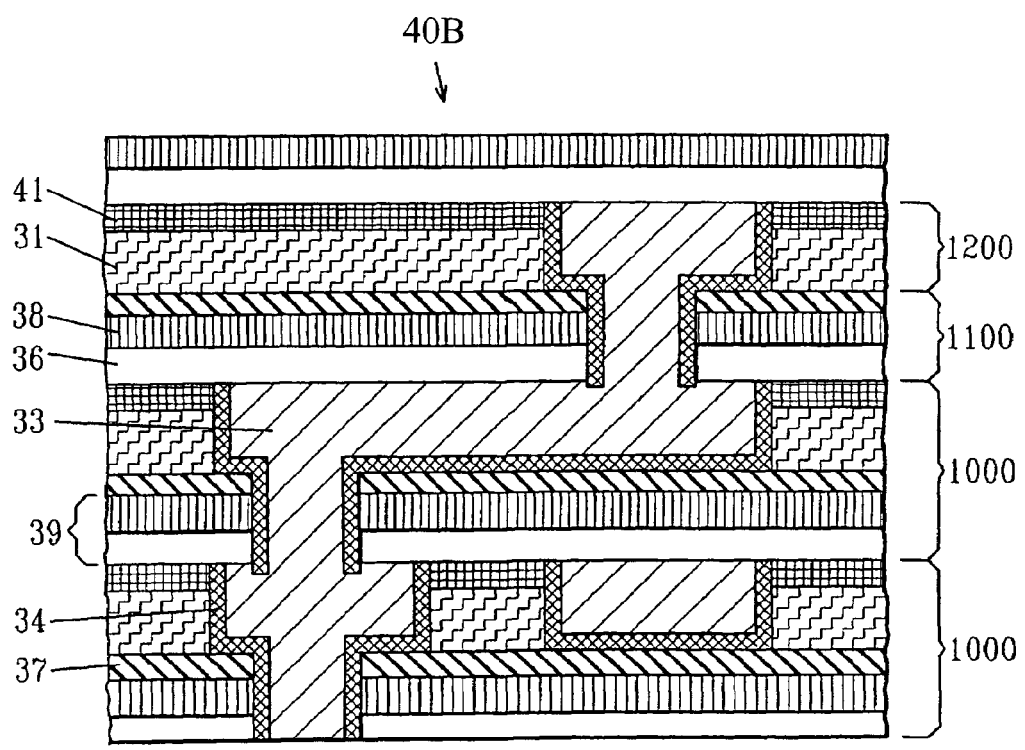
FIG. 2 shows another a prior art example of an interconnect with multiple levels, with each level including both a via level and line level.
Figure 3:
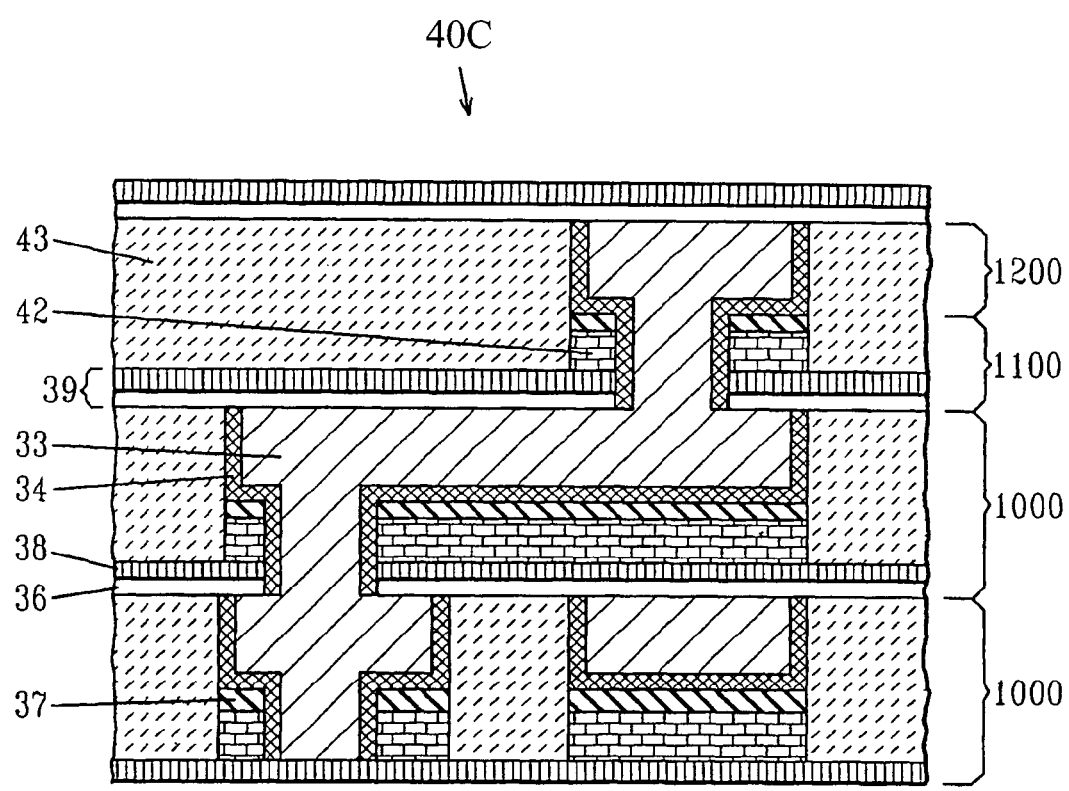
FIG. 3 shows yet another prior art example of an interconnect, with multiple levels with each level including both a via level and a line level.
Figure 4A:
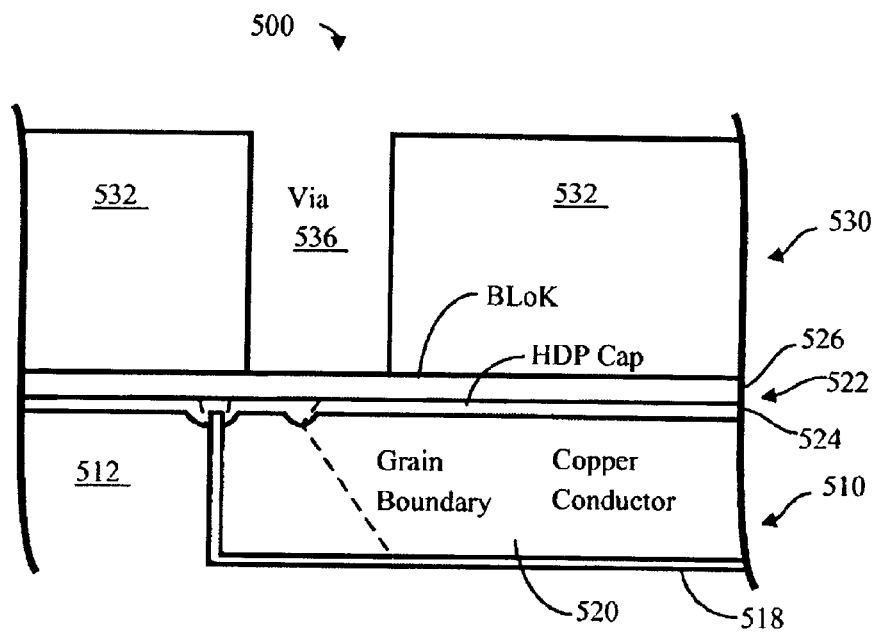
FIG. 4A depicts a prior art interconnect, elevational, cross-section, containing two wiring levels.
Figure 4B:
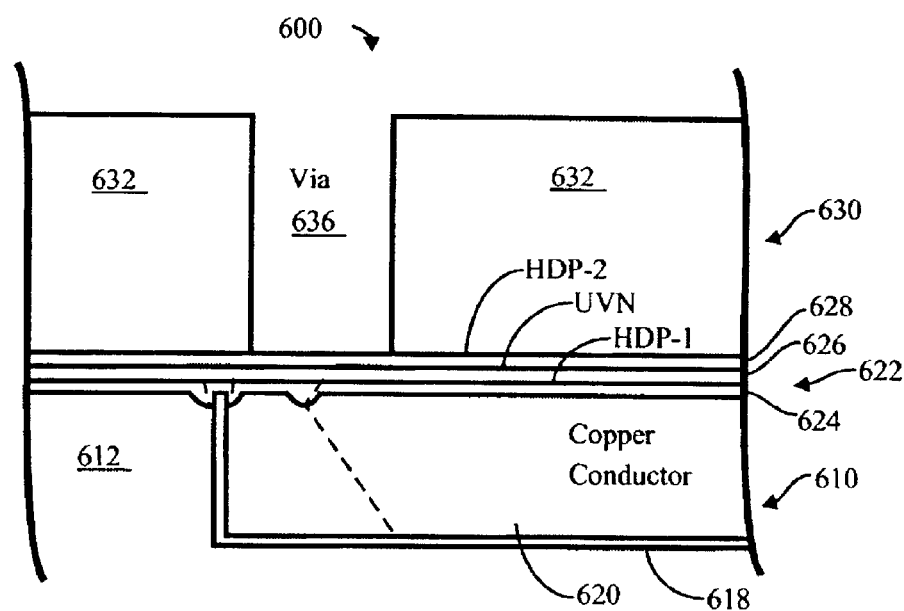
FIG. 4B depicts another prior art interconnect elevational, cross-section, containing two wiring levels.
Figure 5:
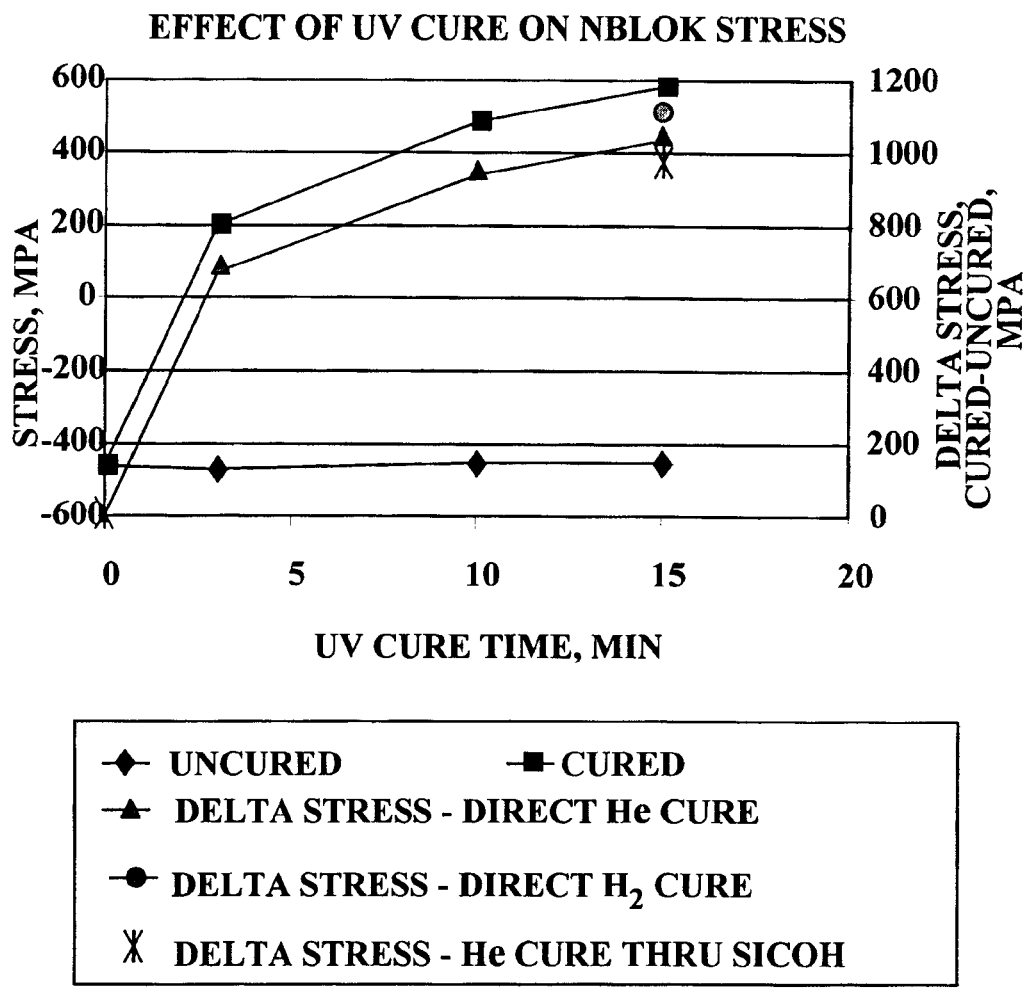
FIG. 5 shows the significant increase in stress of a single SiCN layer upon exposure to different UV cure times.
Figure 6A:
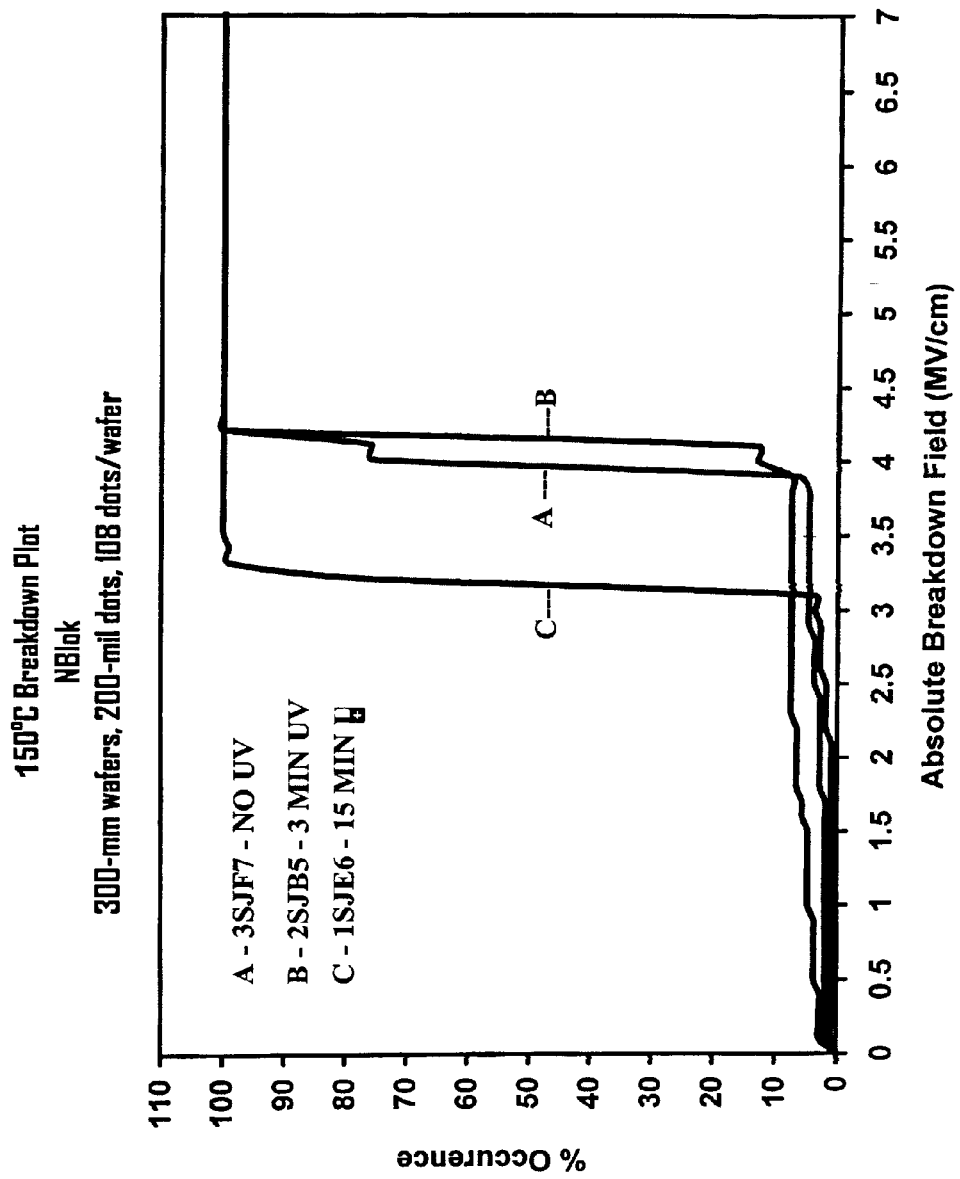
FIG. 6A shows the increased dielectric constant and leakage values of the single SiCN cap layer after UV cure.
Figure 6B:
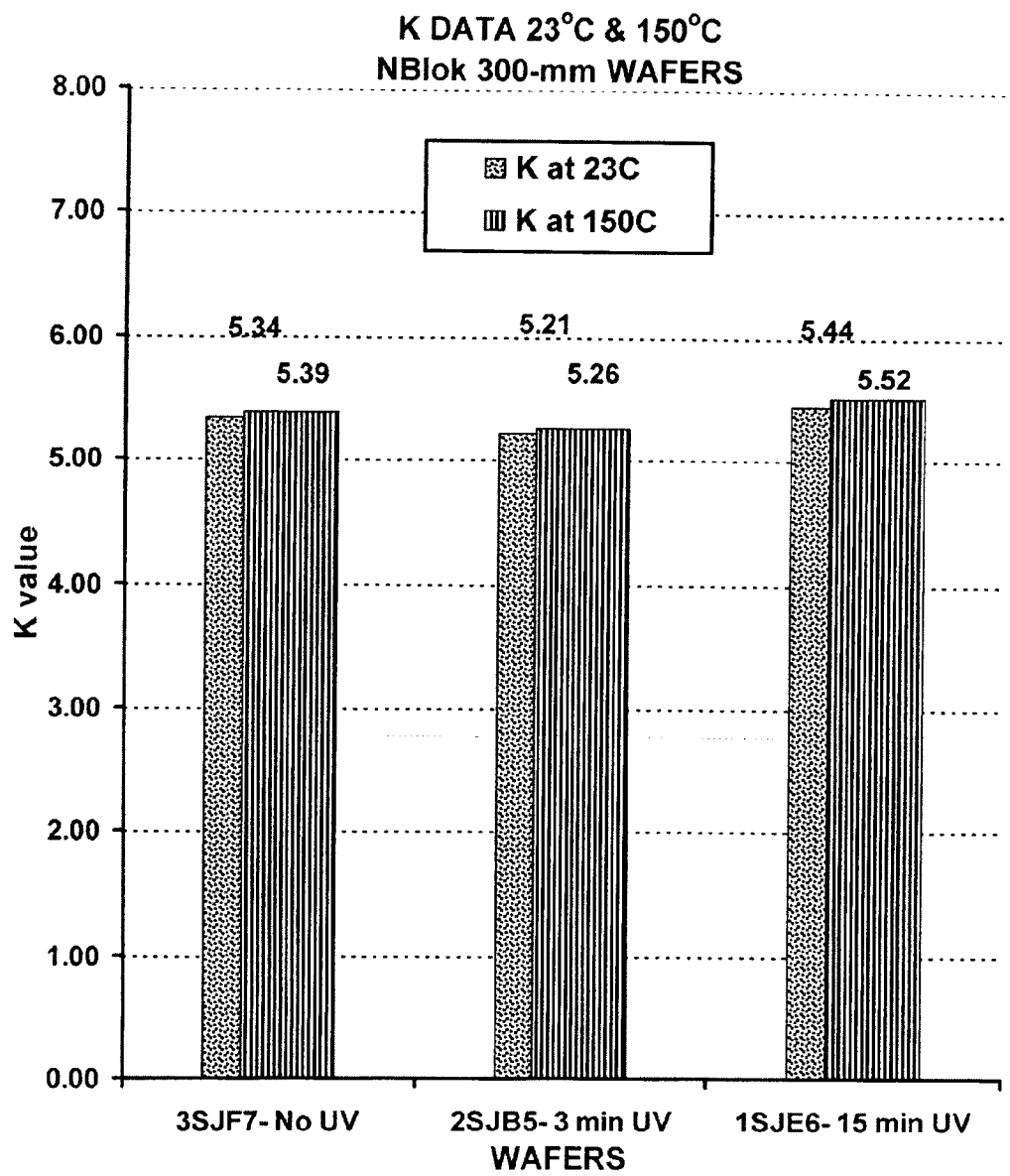
FIG. 6B shows the increased dielectric constant (k) and leakage values of a capping layer after a UV cure.
Figure 7:
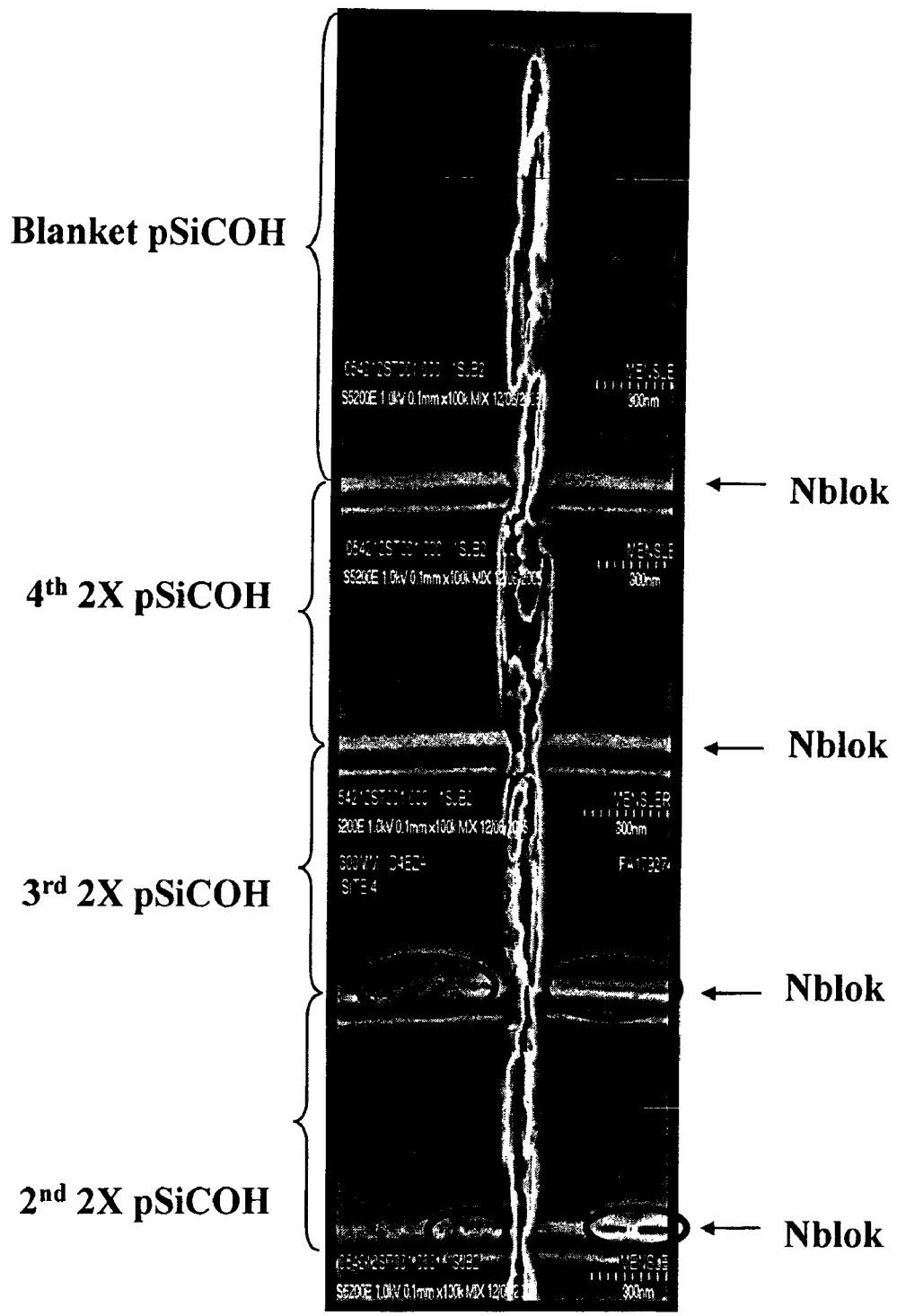
FIG. 7 is a cross sectional SEM image of a BEOL multi-level interconnect with compromised mechanical integrity because of the use of UV cure. The change in a single SiCN cap layer stress from compressive to tensile with UV cure causes cracks to propagate through multiple levels, as the cap no longer offers any resistance to cracking.
Figure 8A:
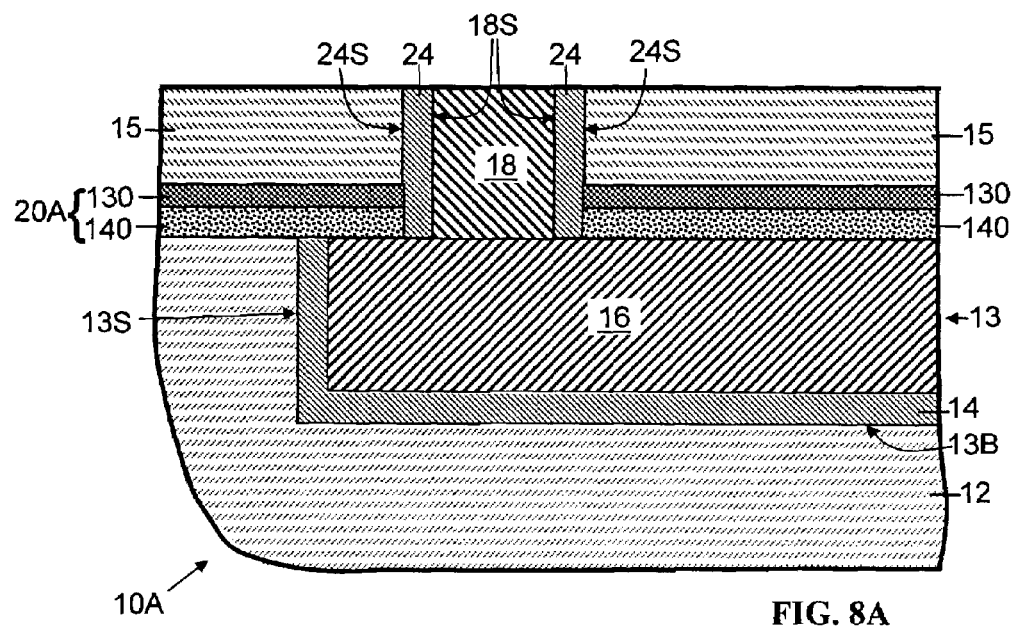
FIGS. 8A-8L are a schematic, sectional elevational views of embodiments of interconnects in accordance with this invention including a multilayer, diffusion inhibiting, cap composed of dual or multiple films including a diffusion barrier film combined with a UV blocking film either in that order, or alternatively, in the reverse order formed on the top surface of a copper conductor. In an embodiment of this invention, an interconnect includes the multi-film dielectric diffusion barrier layer comprised of two or more sub-films that exhibit minimal change in material and electronic properties with UV cure. At least one sub-film is a material having a high C content with a high optical bandgap, which can block UV from modifying the desired properties of the cap layer. At least another of these sub-films may be a CVD deposited film that is impermeable to air and a metal diffusion barrier. The UV blocking film can be placed atop and/or below, and/or in between laminated barrier films. Optionally, adhesion layers may be applied at any of the interfaces in the multi-film dielectric diffusion layer or at interfaces between the sublayers. The multilayered dielectric diffusion barrier layer of the present invention can have a tunable dielectric constant, depending on the thickness of the embedded layer (2 to 10 nm). Composite dielectric constant values can range from ($3<k<7$), while maintaining the required metal diffusion and air barrier properties, and minimizing stress change by UV cure. In addition, the multilayered dielectric diffusion barrier is thermally stable to temperatures greater than 400° C. and can be dense (i.e., non-porous) or porous to further reduce the dielectric constant.

FIG. 8A shows a schematic, sectional, elevational view of an embodiment of an interconnect 10A in accordance with this invention including a diffusion inhibiting, cap comprising a dual film 20A which may be composed of a diffusion barrier film 140 (comprising a barrier to air and metal diffusion) formed on the top surface of a copper conductor 16 with a UV blocking film 130 formed on the top surface of the diffusion barrier film 140. The interconnect 10A includes a lower ILD layer 12. A recess 13 in the lower ILD layer 12 houses a conventional, lower, metallic, diffusion barrier liner 14 on the bottom and sidewalls of the recess, leaving a space filled with the copper conductor 16. Above a portion of the copper conductor 16, not covered by the cap comprising the dual film 20A, a copper via 18 is formed with sidewalls lined by an upper metallic, diffusion barrier liner 24 provided for a copper via conductor 18. As indicated above, aside from the lined copper via 18 and the upper diffusion barrier liner 24, the top surface of the ILD layer 12 and the copper conductor 16 are covered by the cap dual film 20A for purposes of preventing damage to the copper or atomic diffusion of copper from the recess where it is housed. An upper ILD layer 15 is formed above the cap dual film 20A. The upper ILD layer 15 has been planarized to have its upper surface level with the top surface of the via 18, and the upper diffusion barrier liner 24.

In other words, the dual film cap 20A comprises a diffusion barrier film 140 (which is a barrier to an air and metal diffusion) and an embedded UV blocking film 130. In the embodiment shown in FIG. 8A, the diffusion barrier film 140 is located at the bottom half of the dual film 20A, closest to the copper (Cu) conductor 16. The UV blocking film 130 is formed atop the diffusion barrier film 140 for the purpose of blocking UV radiation from reaching the diffusion barrier film 140 to prevent UV radiation from modifying the desirable properties thereof.

Composition of Diffusion Barrier Film

The diffusion barrier film, 140, is preferably a film of the general composition SiCNH. This sublayer can be a dense or a porous material (which may be a dielectric) comprising elements of Si, C, N, and H in a covalently bonded tri-dimensional network with a dielectric constant of less than 6. The term "tri-dimensional network" is used throughout the present application to denote a SiCNH dielectric material which includes silicon, carbon, nitrogen, and hydrogen that are interconnected and interrelated in the x, y, and z directions. The SiCNH dielectric material of the present invention may comprise between about 5 and about 40, more preferably from about 10 to about 20, atomic percent of Si; between about 5 and about 50, more preferably from about 15 to about 40, atomic percent of C; between 0 and about 50, more preferably from about 10 to about 30, atomic percent of N; and between about 10 and about 55, more preferably from about 20 to about 45, atomic percent of H. The SiCNH dielectric material of the present invention may contain molecular scale voids (i.e., nanometer-sized pores) between about 0.3 to about 10 nanometers in diameter, and most preferably between about 0.4 and about 5 nanometers in diameter, which reduce the dielectric constant of the SiCNH dielectric material. The nanometer-sized pores occupy a volume between about 0.5% and about 50% of the material volume.

Composition of UV Blocking Film

A nanoembedded UV blocking film is depicted as a UV blocking film 130, 130U, or 130L in FIGS. 8A-8I. Each of those UV blocking films 130, 130U, or 130L is comprised of UV blocking high band gap films (e.g. boronitride, silicon boronitride, carbon boronitride, silicon carbon boronitride, and silicon carbon films) that can be deposited in a CVD chamber based on prior art. In addition, UV blocking films 130 with a lower band gap, but better mechanical, electrical, and Cu diffusion properties may be employed such as nitrided carbon ($CN_x$) and boron doped nitrided carbon ($CB_xN_y$). Multiple film deposition of the respective caps in a PECVD tool cluster allows for reduced process time and tooling costs since all steps are carried out in the same process flow in the same tool cluster. The UV blocking material of the present invention comprises between about atomic percent 5 and about atomic percent 40, more preferably from about 10 to about 20, atomic percent of Si; between about 5 and about 50, more preferably from about 15 to about 40, atomic percent of C; between 0 and about 50, more preferably from about 10 to about 30, atomic percent of B; between 0 and about 50, more preferably from about 10 to about 30, atomic percent of N; between about 10 and about 55, more preferably from about 20 to about 45, atomic percent of H.

Figure 8B:
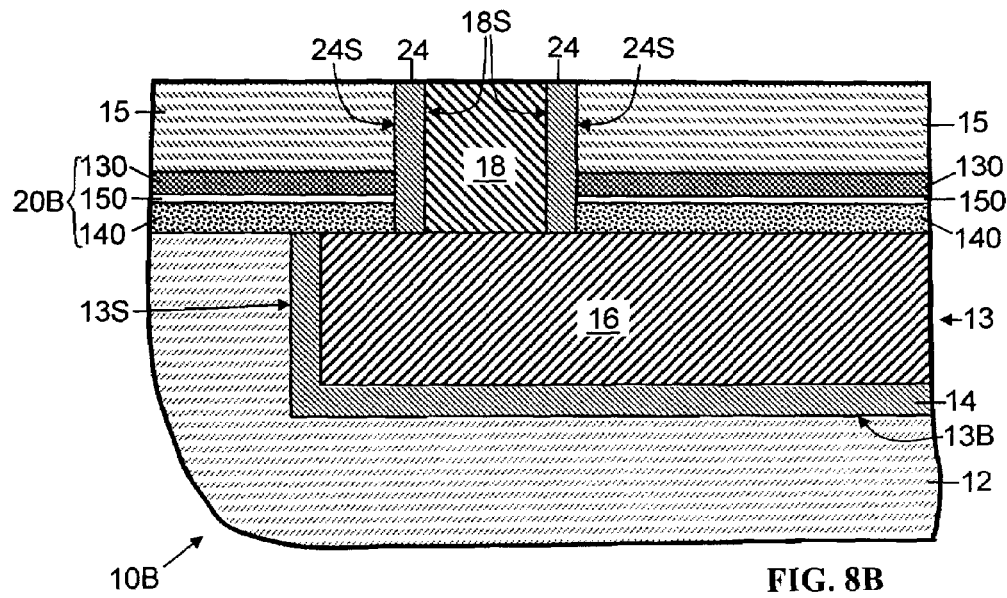

In FIG. 8B, which is a modification of FIG. 8A, showing a schematic, sectional elevational view of an interconnect 10B is shown with a modified triple film cap 20B is formed with an intermediate film 150 present between the sub-films of the multi-film dielectric diffusion barrier films, i.e. the UV blocking film 130 the top surface of the intermediate film 150 and the diffusion barrier film 140 on the bottom shown on the top surface of the copper conductor 16 with the intermediate film 150 therebetween.

Composition of Intermediate Film

The intermediate film 150 of FIG. 8B, which may comprise either an adhesion or a graded film, may be composed of a material selected from the group consisting of $Si_aL_bR_c$, wherein "L" is selected from the group consisting of hydroxyl, methoxy, ethoxy, acetoxy, alkoxy, carboxy, amines, halogens. "R is selected from the group consisting of hydride, methyl, ethyl, vinyl, and phenyl (any alkyl or aryl); "a" is from 0.25 to 0.5, "b" is from 0.1 to 0.8, "c" is from 0 to 0.7, and the sum of a+b+c=1. The adhesion film 150, which can be deposited by spin on or CVD (plasma, thermal, evaporation) processing, can be in the form of a compositional graded layer.

Process for Forming Triple Film Structure

The triple film structure in FIG. 8B can be formed in a single CVD deposition process for efficiency of the process with the UV blocking film 130 on top and the diffusion barrier film 140 on the bottom with the intermediate film 150 therebetween. Multi-film deposition of the respective caps in a PECVD tool cluster allows for reduced process time and tooling costs since all steps are carried out in the same process flow in the same tool cluster. Additionally, the intermediate film 150 can also be regarded as a transition film that is formed during the plasma enhanced chemical vapor deposition process. This will likely form during the transition between the chemistries involved in the deposition of the diffusion barrier film 140 versus the UV blocking film 130. The intermediate film 150 will then be of an intermediate composition of the two other sub-films 130 and 140 in this triple film cap 20B.

Figure 8C:
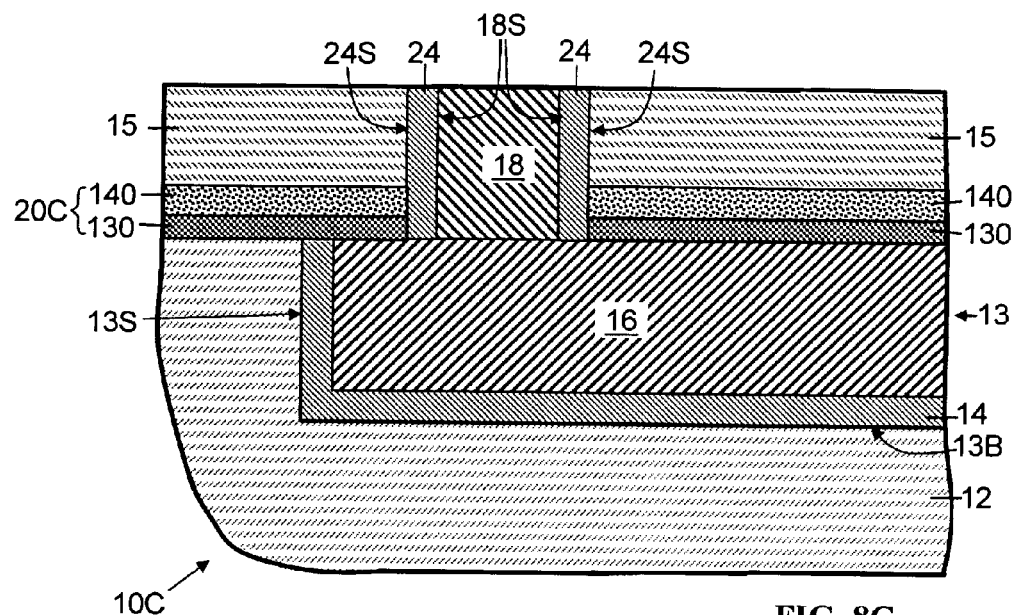

In FIG. 8C, which is a modification of FIG. 8A, showing a schematic, sectional elevational view of an interconnect 10C is shown with a reversed dual film cap 20C which is the reverse of the dual film cap 20A of FIG. 8A. This reversed dual film cap 20C includes a lower UV blocking film 130 formed on the top surface of the copper conductor 16 located below the upper diffusion barrier film 140. The diffusion barrier film 140 is shown formed on the top surface of the intermediate layer 150. This reversed dual film cap 20C structure is used to protect the underlying substrate from UV modification. This embodiment is applicable for cases wherein the diffusion barrier film 140 is not susceptible to damage by UV radiation, but the materials including that of UV blocking film 130, etc. thereunder are susceptible to such damage by UV radiation.

Figure 8D:
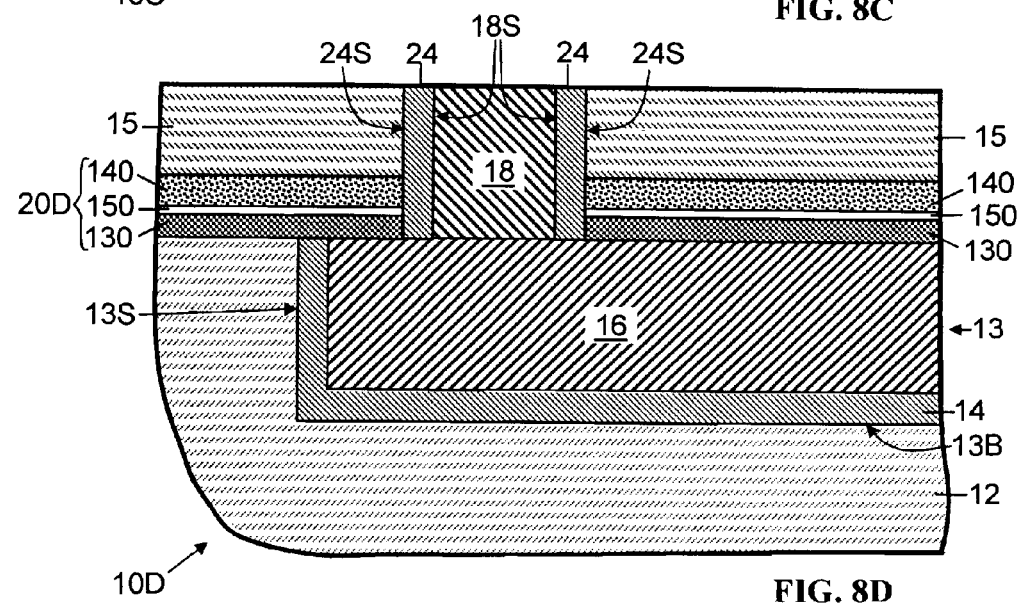

FIG. 8D shows another embodiment of this invention comprising a schematic, sectional elevational view of an interconnect 10D which is a modification of FIG. 8C, with a modified triple film cap 20D with an intermediate layer 150 present between the diffusion barrier film 140 and the UV blocking film 130 which is the reverse of the triple film cap 20B of FIG. 8B. The triple film cap 20D is formed with an intermediate layer 150 present between the sub-films of the multilayered dielectric diffusion barrier films, i.e. the UV blocking film 130 on top and the diffusion barrier film 140 on the bottom with the intermediate layer 150 therebetween. FIG. 8D shows the lower UV blocking film 130 formed on the top surface of the copper conductor 16, but it has the intermediate layer 150 formed on the top surface thereof with the diffusion barrier film 140 formed on the top surface of the intermediate layer 150.

Figure 8E:
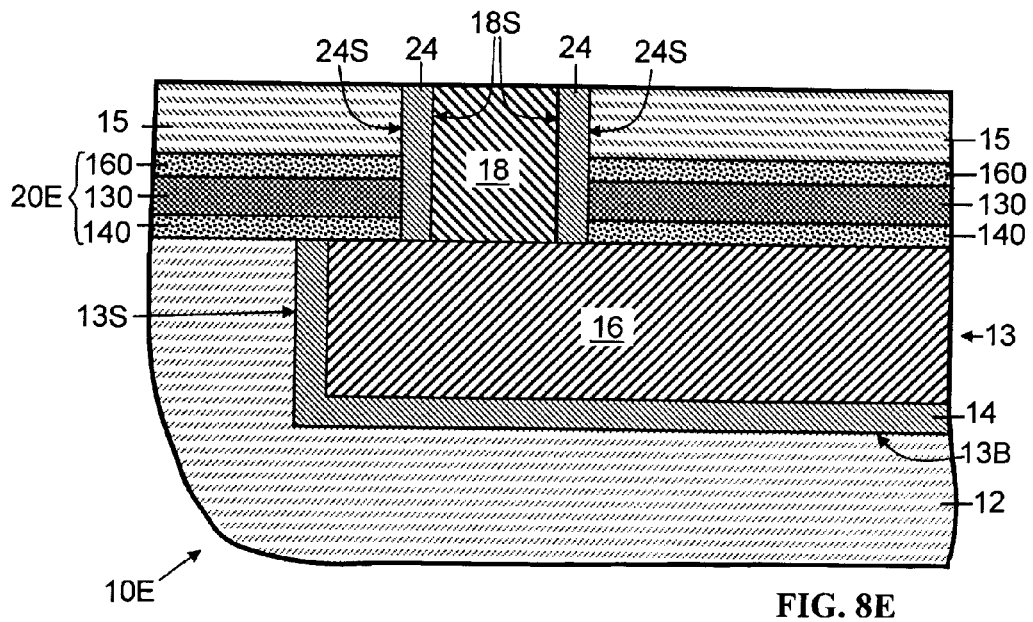

FIG. 8E shows an embodiment of comprising a schematic, sectional elevational view of an interconnect 10E which is a modification of FIG. 8A in accordance with this invention incorporating a triple film cap 20E. The triple film cap 20E is formed with an intermediate, UV blocking film 130 sandwiched between a lower, diffusion barrier film 140 and an upper, dielectric, diffusion barrier film 160. This triple film cap 20E allows for partial penetration of UV radiation into the lower diffusion film 140, and complete UV radiation penetration in the upper, diffusion barrier film 160. In the triple film cap 20E, the upper, dielectric, diffusion barrier film 160 can be composed of the same material as the lower, diffusion barrier film 140, or can be composed of an entirely different material as required by the specific application.

Figure 8F:
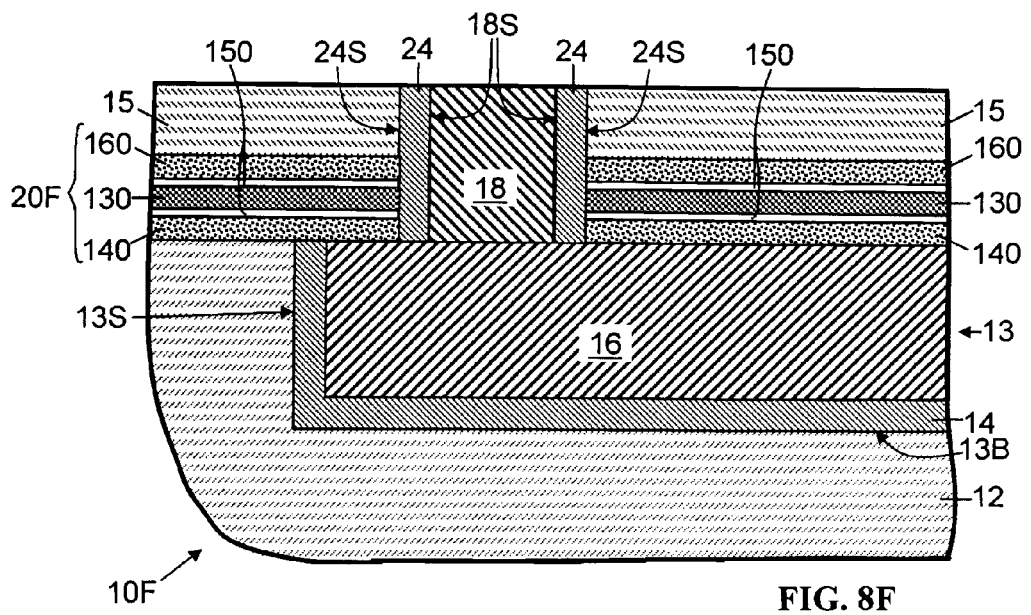

FIG. 8F comprises a schematic, sectional elevational view of an embodiment of this invention comprising another interconnect 10F which is a modification the interconnect of FIG. 8D incorporating a quintuple film cap 20F with a pair of intermediate adhesion or graded between the lower, diffusion barrier film 140, the UV blocking film 130, and the upper, diffusion barrier film 160 of FIG. 8D. From top to bottom there is the upper diffusion barrier film 160, a first intermediate film 150, UV blocking film 130, a second intermediate film 150, and the lower, diffusion barrier film 140 on the top surface of the copper conductor 16.

Figure 8G:
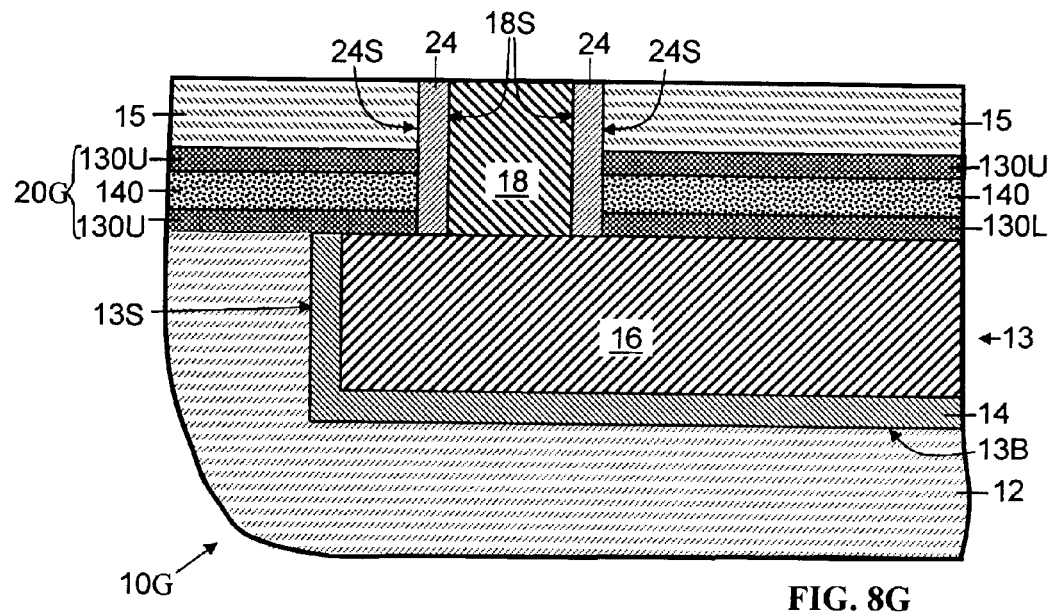

FIG. 8G comprises a schematic, sectional elevational view of an interconnect 10G which is a modification the interconnect of FIG. 8E in accordance with this invention. The interconnect 10G incorporates a multiple film cap 20G with deposits of a lower UV blocking film 130L formed on the top surface of the copper conductor 16. A triple diffusion barrier film 140 is formed on the top surface of the lower UV blocking film 130L. An upper UV blocking film 130U is formed on the top surface of the diffusion barrier film 140 so that the diffusion barrier film 140 is sandwiched between the lower UV blocking film 130L and the upper UV blocking film 130U. The upper UV blocking film 130U and the lower UV blocking film 130L block UV radiation from penetration into or through the copper conductor 16, the barrier layer 14, or the lower ILD layer 12.

Figure 8H:
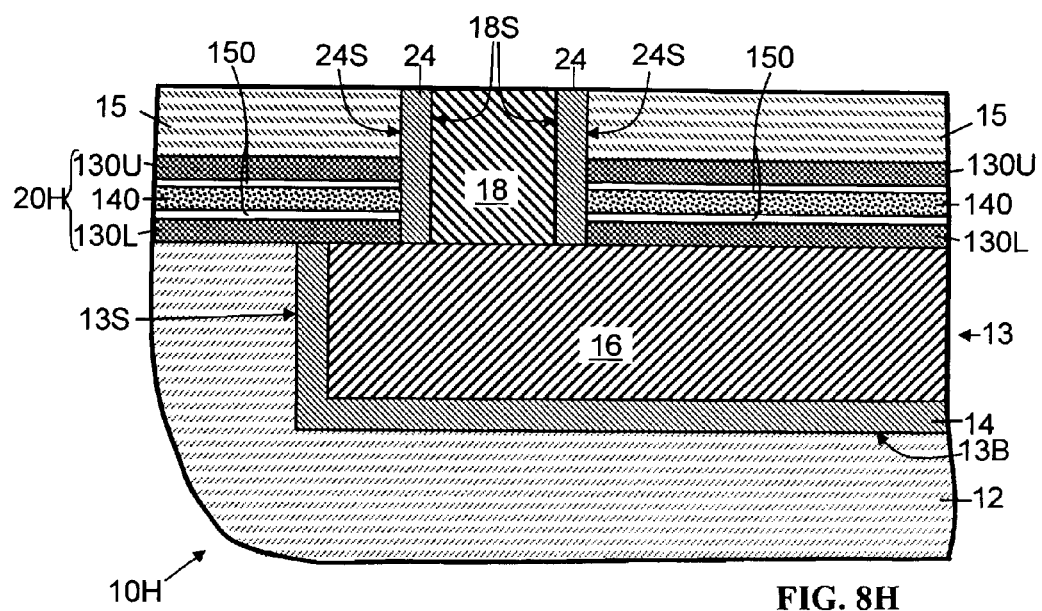

FIG. 8H comprises a schematic, sectional elevational view of an interconnect 10H which is a modification the interconnect of FIG. 8G in accordance with this invention incorporating a multiple film cap 20H with a deposit of a lower UV blocking film 130L formed on the top surface of the copper conductor 16. A diffusion barrier film 140 is formed on the top surface of the lower UV blocking film 130L. An upper UV blocking film 130U is formed on the top surface of the diffusion barrier film 140, so the diffusion barrier film 140 is sandwiched between the lower UV blocking film 130L and the upper UV blocking film 130U. The diffusion barrier film 140 blocks UV radiation from penetrating the bottom UV blocking film 130L, as well as the ILD layer 12 beneath the diffusion barrier film 140 and the bottom UV blocking film 130L. A set of intermediate adhesion or graded films 150 is provided between the lower UV blocking film 130L, the diffusion barrier film 140 and the upper UV blocking film 130U. From top to bottom there is the upper UV blocking film 130U, a first intermediate film 150, diffusion barrier film 140, a second intermediate film 150, and the lower UV blocking film 130L on the top surface of the copper conductor 16.

Figure 8I:
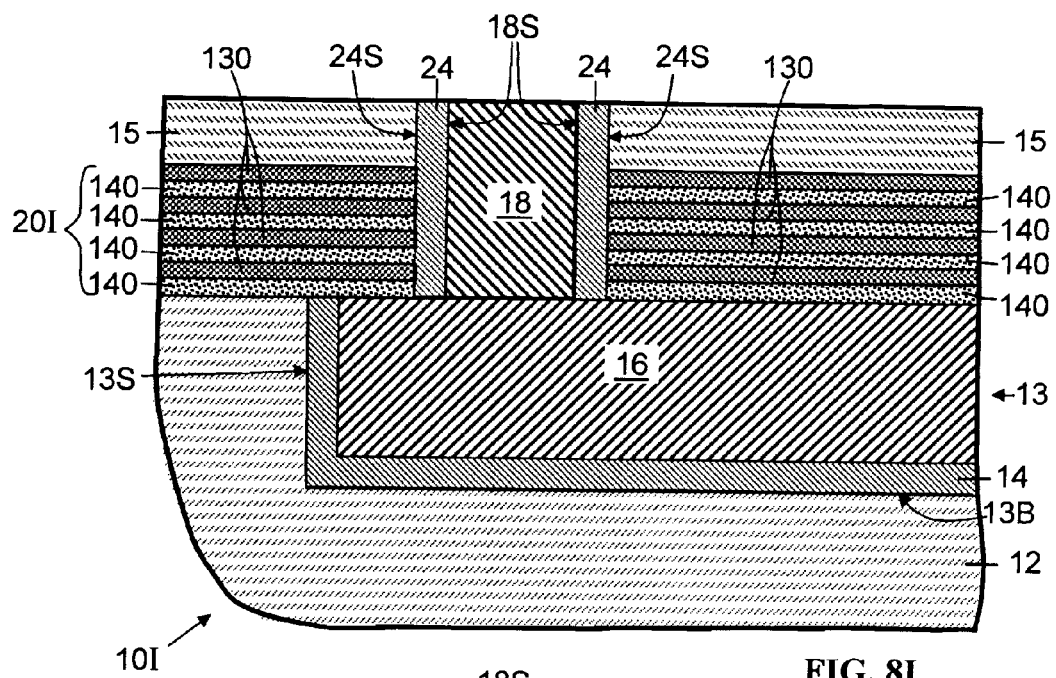

FIG. 8I comprises a schematic, sectional elevational view of an interconnect 10I which is a modification of the interconnect of FIG. 8A in accordance with this invention incorporating a multiple film cap 20I formed with multiple films, i.e. four UV blocking films 130, which are alternately laminated with multiple films, i.e. four diffusion barrier films 140. This set of deposits provides overall enhancement of the degree of blocking of UV radiation within both the UV blocking films 130 and the lower diffusion barrier films 140. As shown in FIG. 8A, there is an upper UV blocking film 130 on top, followed by an upper, diffusion barrier film 140. Those films are followed by a second UV blocking film 130, followed by a second diffusion barrier film 140, etc. until there is a set four diffusion barrier films 140 interleaved with a set of four UV blocking films 130. The four sets of films 140/130 in sequence is illustrative and any multiplicity of sets thereof is contemplated as an alternative.

Figure 8J:
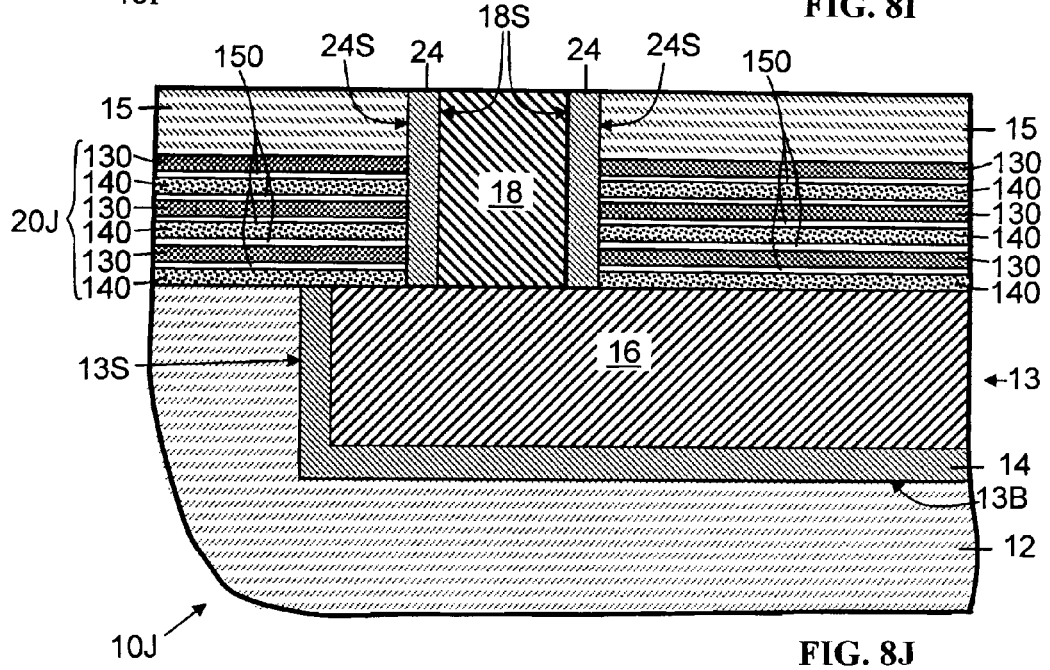

FIG. 8J comprises a schematic, sectional elevational view of an interconnect 10J which is modification of the embodiment of FIG. 8D in accordance with this invention incorporating a multiple film cap 20J formed with multiple films, i.e. three UV blocking films 130, which are alternately laminated with multiple films, i.e. three diffusion barrier films 140 with a set of intermediate adhesion or graded films 150 therebetween. This set of deposits provides overall enhancement of the degree of blocking of UV radiation within both the UV blocking films 130 and the lower diffusion barrier films 140. As shown in FIG. 9F, there is an upper UV blocking film 130 on top, followed by an intermediate film 150 and an upper diffusion barrier film 140, followed by an intermediate film 150 and a second UV blocking film 130, followed by an intermediate film 150 and a second diffusion barrier film 140, etc. until there is a set of three diffusion barrier films 140 interleaved with a set of three UV blocking films 130. This includes the set of five intermediate adhesion or graded films 150 therebetween. The sets of films 140/150/130/150 in sequence is illustrative and any multiplicity of sets thereof is contemplated as an alternative.

Figure 8K:
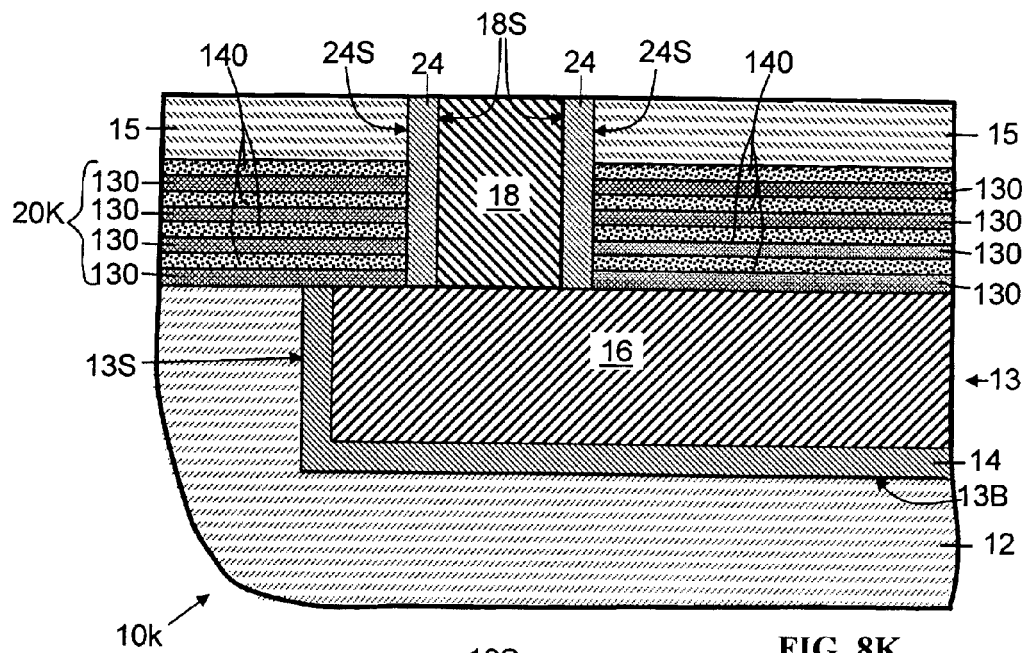

FIG. 8K comprises a schematic, sectional elevational view of an interconnect 10K which is a modification of the interconnect of FIG. 8C in accordance with this invention incorporating a multiple film cap 20K formed with multiple films, i.e. four UV blocking films 130, which are alternately laminated with multiple films, i.e. four diffusion barrier films 140. This set of deposits provides overall enhancement of the degree of blocking of UV radiation within both the lower UV blocking films 130 and the upper diffusion barrier films 140. As shown in FIG. 8C, there is a diffusion barrier film 140 on top followed by an upper, an upper UV blocking film 130. Those films are followed by a second diffusion barrier film 140, followed by a second UV blocking film 130, etc. until there is a set four diffusion barrier films 140 interleaved with a set of four UV blocking films 130. The four sets of films 130/140 in sequence is illustrative and any multiplicity of sets thereof is contemplated as an alternative.

Figure 8L:
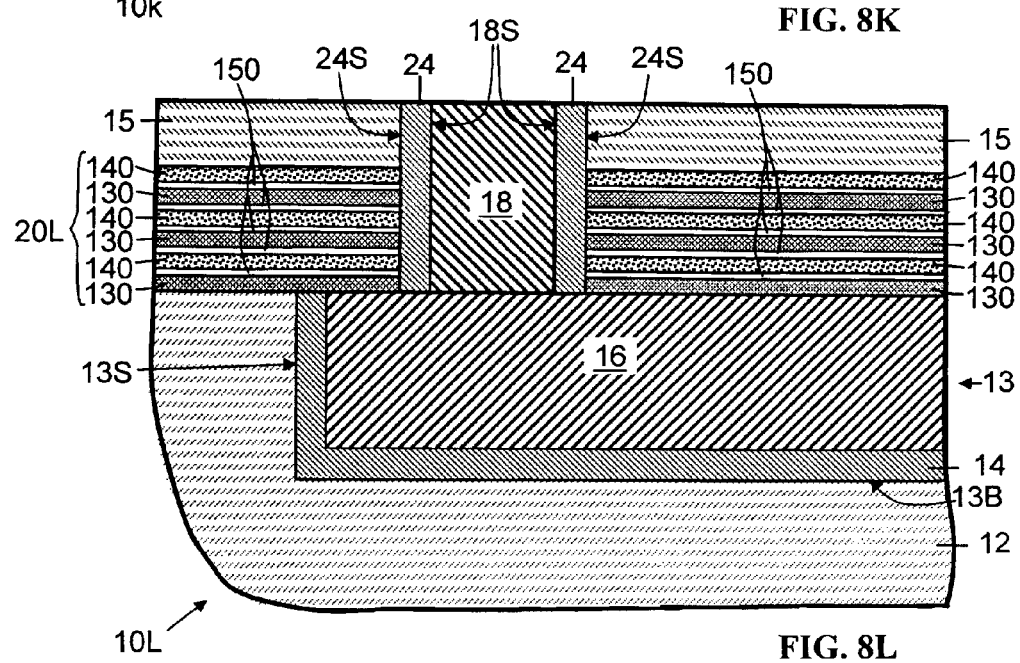

FIG. 8L comprises a schematic, sectional elevational view of an interconnect 10L which is modification of the embodiment of FIG. 8D in accordance with this invention incorporating a multiple film cap 20L formed with multiple films, i.e. three diffusion barrier films 140, which are alternately laminated with multiple films, i.e. three UV blocking films 130 with a set of intermediate adhesion or graded films 150 therebetween. This set of deposits provides overall enhancement of the degree of blocking of UV radiation within both the upper diffusion barrier films 140 and the lower UV blocking films 130. As shown in FIG. 9H, there is an upper diffusion barrier film 140 followed by an upper UV blocking film 130 on top, followed by an second diffusion barrier film 140 followed by a second UV blocking film 130, etc. until there is a set three diffusion barrier films 140 interleaved with set four UV blocking films 130. This includes a set of five intermediate adhesion or graded films 150 therebetween. The sets of films 130/150/140/150 in sequence is illustrative and any multiplicity of sets thereof is contemplated as an alternative.

FIGS. 9A-9L show flow charts of alternative sequences of process flows in accordance with this invention that correlate with the embodiments described above.

Figure 9A:
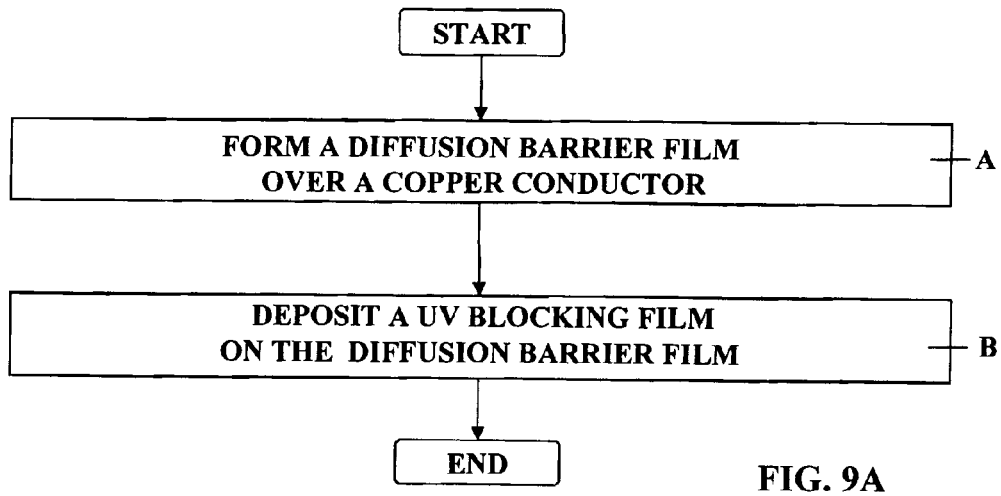
FIGS. 9A-9L are flow charts of process steps in accordance with this invention for forming interconnects corresponding to those shown in FIGS. 8A-8L.

FIG. 9A shows a flow chart relating to FIG. 8A for formation of the dual film cap 20A as described above. In step A of FIG. 9A the diffusion barrier film 140 is formed first. Next, in step B, the UV blocking film 130 is deposited onto the top surface of the diffusion barrier film 140, preferably by placing the device 10A in a CVD chamber. Then the process of formation of the cap 20A in FIG. 8A has been completed. The diffusion barrier film 140 and the UV blocking film 130 may be composed of the materials described above.

Figure 9B:
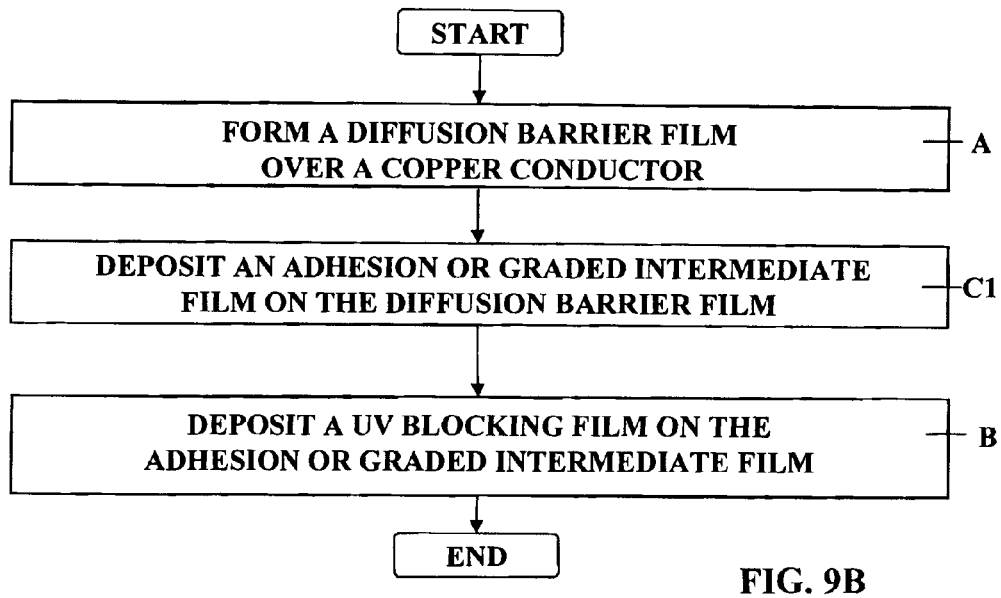

FIG. 9B shows a flow chart which relating to FIG. 8B for formation of the trilayer 20B described above. As in FIG. 9A, step A is the first step in FIG. 9B. In step A, the barrier film 140 is deposited over the copper conductor 16. Next in step C1, a deposit is made of an intermediate film 150 over the barrier film 140. Next, step B follows in which the UV blocking film 130 is formed over the intermediate film 150. At this point the process of formation of the trilayer 20B of FIG. 8B has ended. The diffusion barrier film 140, the UV blocking film 130 and the intermediate film 150 may be composed of the materials described above.

Figure 9C:
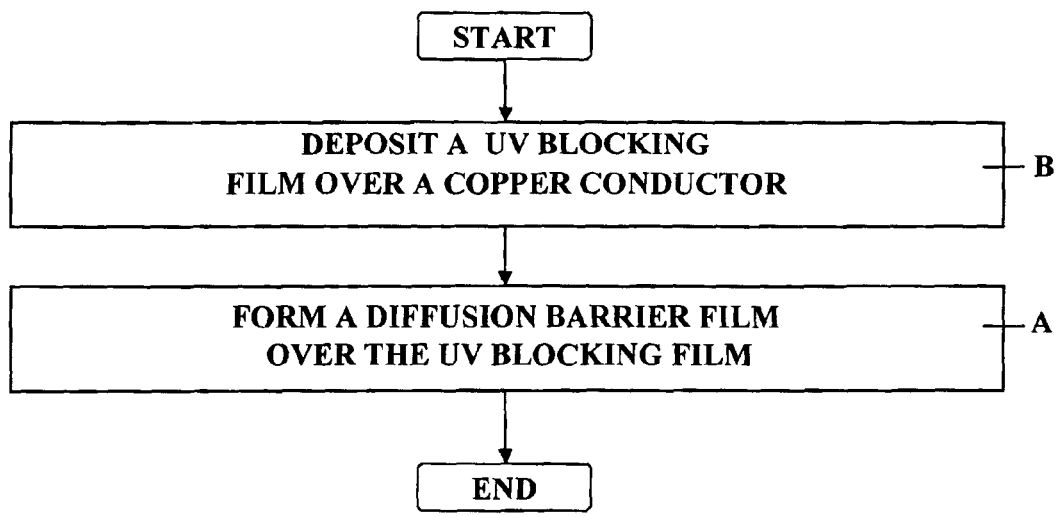

FIG. 9C shows a flow chart which relating to FIG. 8C for formation of the dual film 20C in FIG. 8C as described above. In the first step in FIG. 9C which is step B, the UV blocking film 130 is formed directly on the top surface of the copper conductor 16. Then follows step A comprising formation of the diffusion barrier film 140 over the UV blocking film 130. Then the process of formation of the cap 20C in FIG. 8C has been completed. The diffusion barrier film 140 and the UV blocking film 130 may be composed of the materials described above.

Figure 9D:
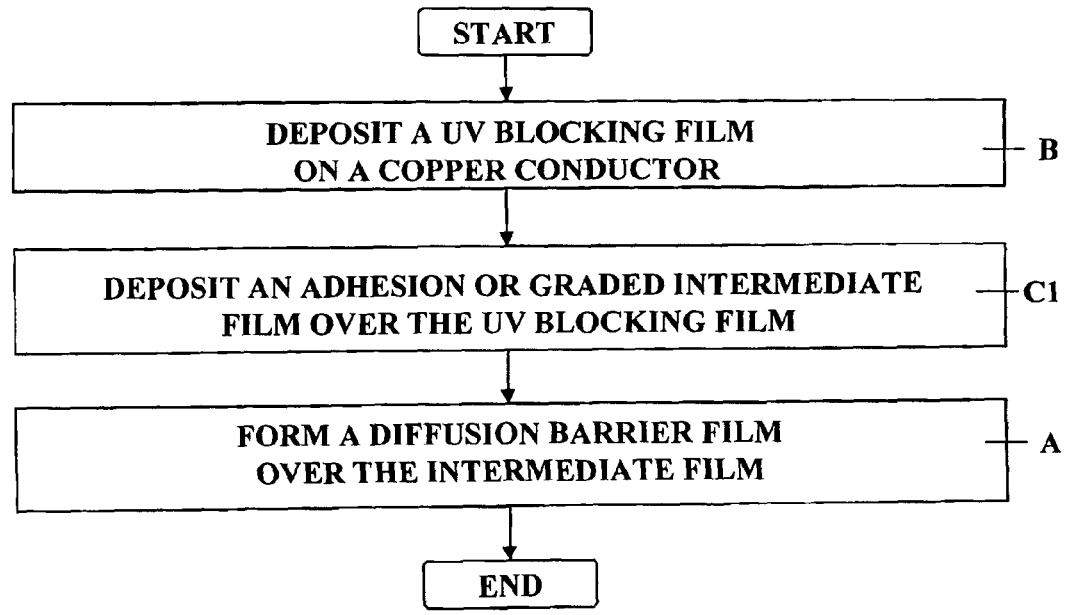

FIG. 9D shows a flow chart which relating to FIG. 8D for formation of the trilayer 20D in FIG. 8D. In the first step in FIG. 9D which is step B, the UV blocking film 130 is formed directly on the top surface of the copper conductor 16. Next is step C1 in which a deposit is made of an intermediate film 150 on the UV blocking film 130. Then follows step A comprising formation of the diffusion barrier film 140 over the intermediate film 150. The diffusion barrier film 140, the UV blocking film 130 and the intermediate film 150 may be composed of materials as described above.

Figure 9E:
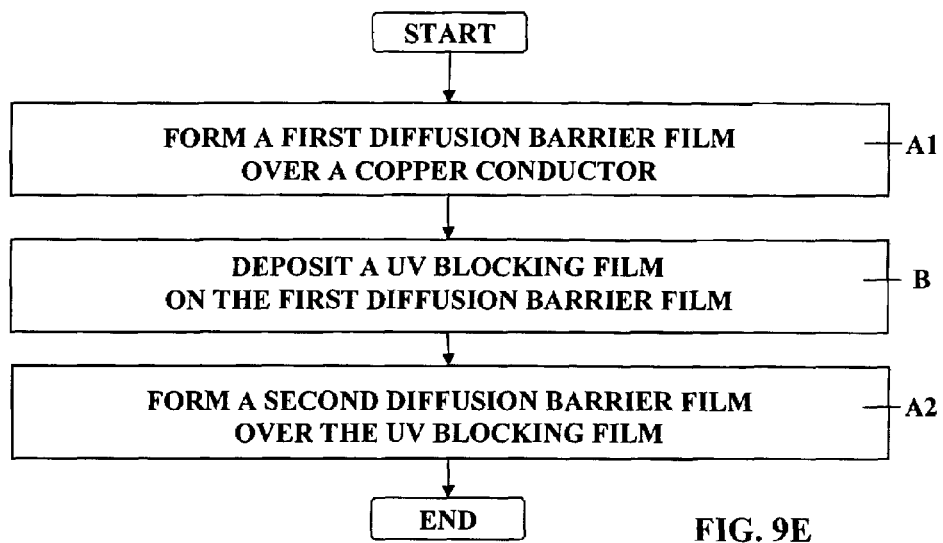
Figure 9F:
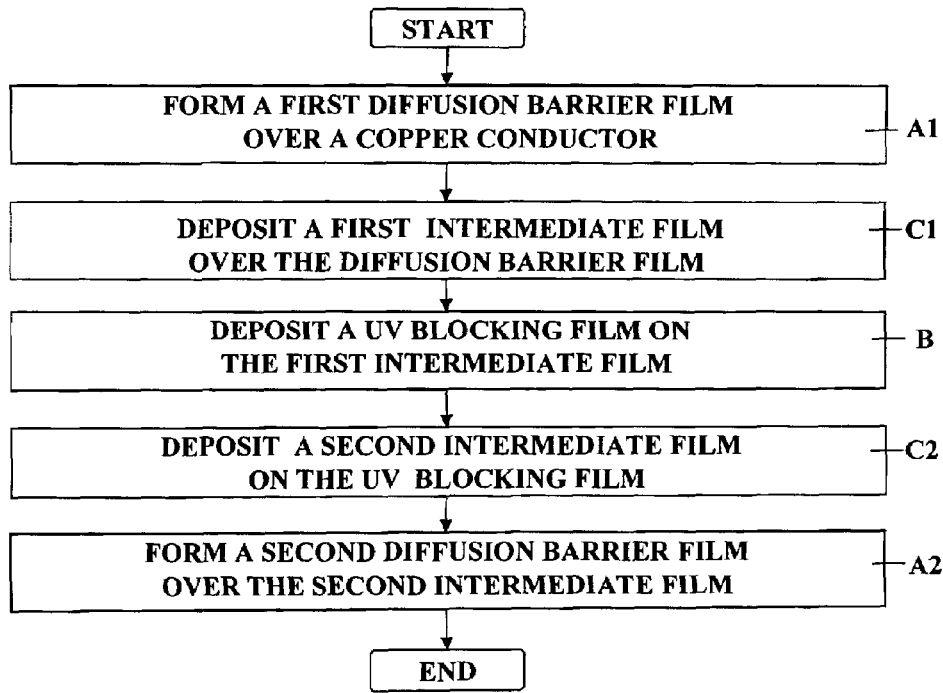

FIG. 9E shows a flow chart which relating to formation of the triple film cap 20E in FIG. 8E. In the first step in FIG. 9E which is step A1, a first, lower diffusion barrier film 140 is formed directly on the top surface of the copper conductor 16. Then follows step B comprising formation of a UV blocking film 130 over the first, lower diffusion barrier film 140. Next in step B2, an upper diffusion barrier film 160 is formed directly on the top surface of the UV blocking film 130. Then the process of formation of the 20E in FIG. 9E has been completed. The diffusion barrier films 140/160 and the UV blocking film 130 may be composed of materials as described above.

FIG. 9F shows a flow chart which relating to FIG. 9B for formation of the trilayer 20F in FIG. 8F. In the first step in FIG. 9F which is step A1, a first, lower diffusion barrier film 140 is formed directly on the top surface of the copper conductor 16. Next in step C1 a deposit is made of a first intermediate film 150 on the lower diffusion barrier film 140. Then follows step B comprising formation of a UV blocking film 130 over the first intermediate film 150. Next is step C2 in which a deposit is made of a second intermediate film 150 on the UV blocking film 130. Next in step A2, a second, upper diffusion barrier film 160 is formed directly on the top surface of the second intermediate film 150. Then the process of formation of the cap 20f in FIG. 9f has been completed. The diffusion barrier films 140/160 and the UV blocking film 130 may be composed of materials as described above.

Figure 9G:
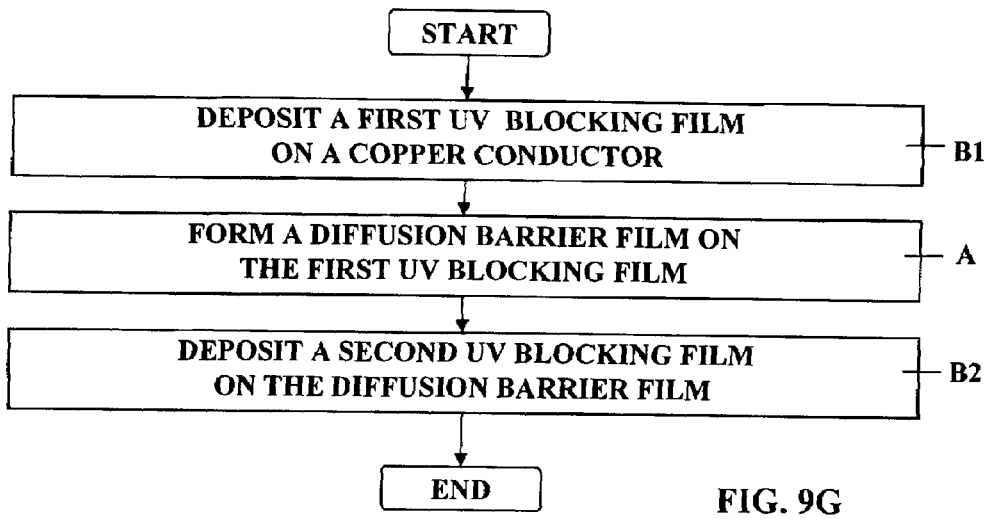
Figure 9H:
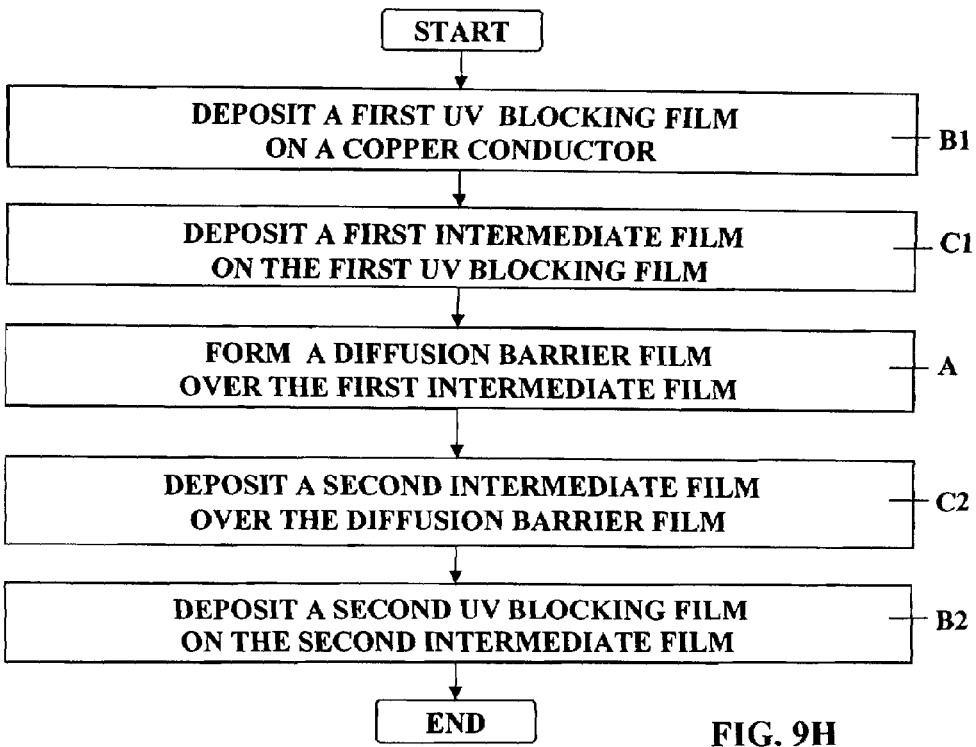
Figure 9I:
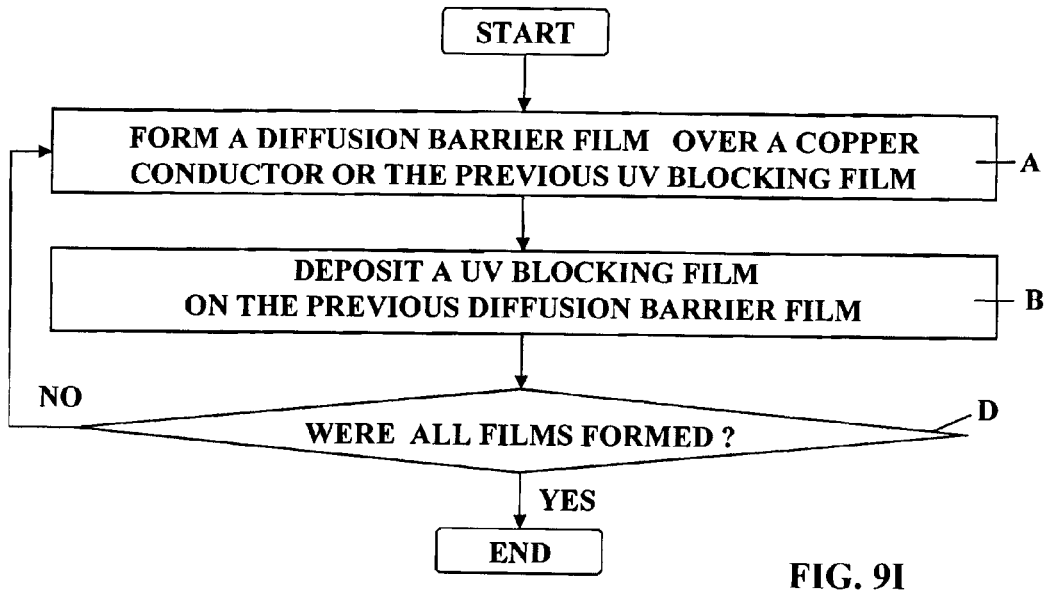

FIG. 9G shows a flow chart relating to FIG. 8G for formation of the triple film cap 20G as described above. In step B1 of FIG. 9G a first, lower UV blocking film 130L is formed over the copper conductor 16. Next, in step A, the diffusion barrier film 140 is deposited onto the top surface of the lower UV blocking film 130L. Then in step B2 of FIG. 9G an upper UV blocking film 130U is formed over the diffusion barrier film 140. Then the process of formation of the cap 20G in FIG.

8G has been completed. The diffusion barrier film 140 and the UV blocking films 130L/130U may be composed of the materials described above.

FIG. 9G shows a flow chart relating to FIG. 8G for formation of the triple film cap 20G as described above. In step B1 of FIG. 9G a first, lower UV blocking film 130L is formed over the copper conductor 16. Next, in step A, the diffusion barrier film 140 is deposited onto the top surface of the lower UV blocking film 130L. Then in step B2 of FIG. 9G an upper UV blocking film 130U is formed over the diffusion barrier film 140. Then the process of formation of the cap 20G in FIG. 8G has been completed. The diffusion barrier film 140 and the UV blocking films 130L/130U may be composed of the materials described above.

FIG. 9H shows a flow chart relating to FIG. 8H for formation of the quintuple film cap 20H as described above. In step B1 of FIG. 9H a first, lower UV blocking film 130 is formed. Next in step C1 a deposit is made of a first intermediate film 150 on the UV blocking film 130 therebelow. Next, in step A, a diffusion barrier film 140 is deposited onto the top surface of the first intermediate film 150. Next in step C1 a deposit is made of a first intermediate film 150 on the diffusion barrier film 140. Then, in step B2 of FIG. 9H a second, upper UV blocking film 130 is formed.

Then in step D, a test is made as to whether all of the films to be formed have been formed. If NO, then steps A and B are repeated until the answer to the test in step D is YES. The result of the test in step D will be NO until several films have been formed. If the result of the test in step D is YES, then the process of formation of the cap 20I in FIG. 8H has been completed. The diffusion barrier film 140 and the UV blocking film 130 may be composed of the materials described above.

Figure 9J:
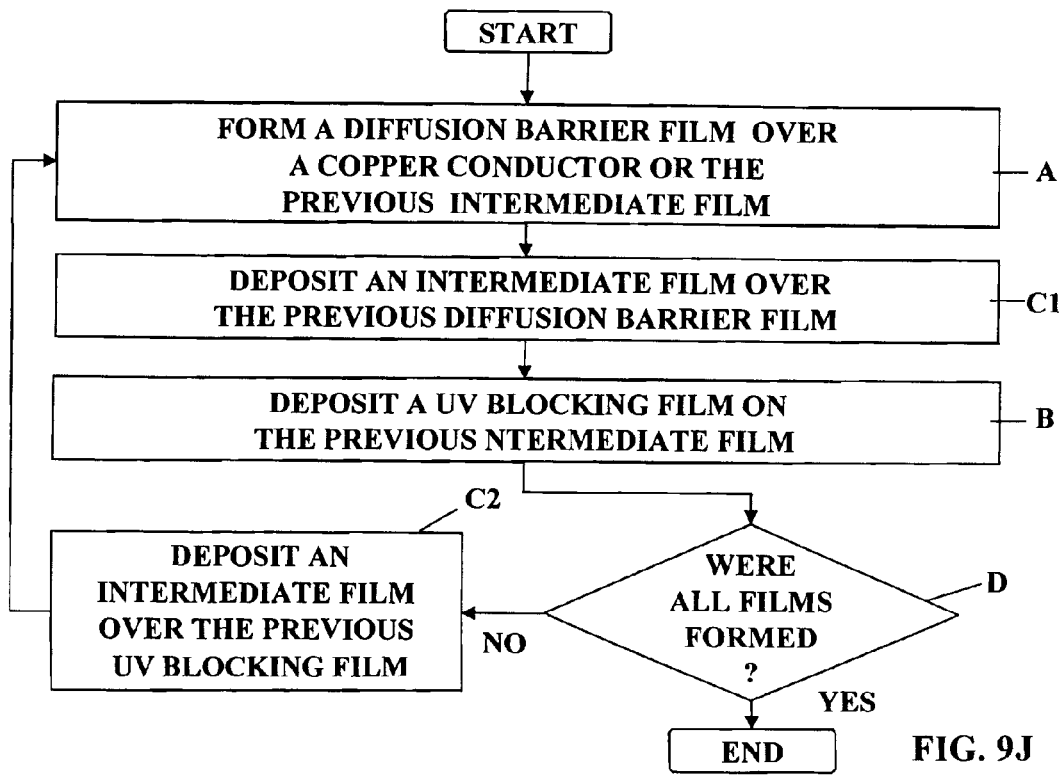

FIG. 9J shows a flow chart relating to FIG. 8J for formation of the dual film cap 20I as described above. In step A of FIG. 9J a diffusion barrier film 140 is formed first. Next in step C1 a deposit is made of a first intermediate film 150 on the diffusion barrier film 140 therebelow. Next, in step B, a UV blocking film 130 is deposited onto the top surface of the first intermediate film 150. Then in step D, a test is made as to whether all of the films to be formed have been formed. If NO, then steps A and B are repeated until the answer to the test in step D is YES. The result of the test in step D will be NO until several films have been formed. If the result of the test in step D is YES, then the process of formation of the cap 20J in FIG. 8J has been completed. The diffusion barrier film 140 and the UV blocking film 130 may be composed of the materials described above.

Figure 9K:
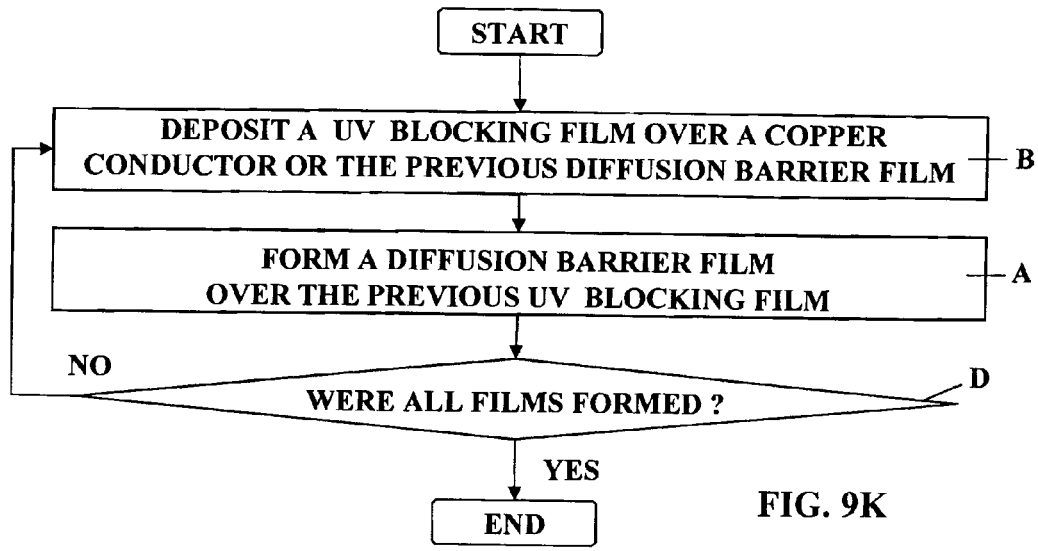

FIG. 9K shows a flow chart which relating to FIG. 9K for formation of the dual film 20K in FIG. 9K as described above. In step B in FIG. 9K, the UV blocking film 130 is formed directly on the top surface of the copper conductor 16. Then follows step A comprising formation of the diffusion barrier film 140 over the UV blocking film 130. Then in step D a test is made as to whether all of the films which were to be formed have been formed. If NO, then step B and step A are repeated until the answer to the test in step D is YES. The result of the test in step D will be NO until several films have been formed as described above with respect to FIG. 8G. If the result of the test in step D is YES, then the process of formation of the cap 20K in FIG. 9K has been completed. The diffusion barrier film 140 and the UV blocking film 130 may be composed of the materials described above.

Figure 9L:
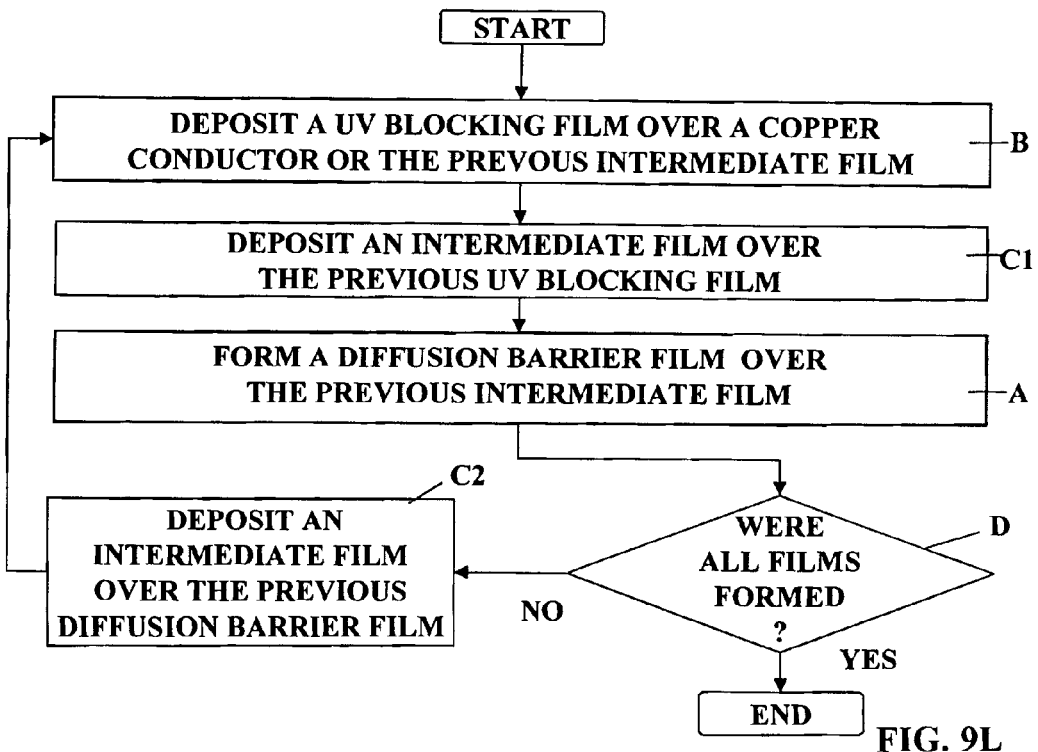

FIG. 9L shows a flow chart relating to FIG. 8L for formation of the dual film cap 20I as described above. In step B of FIG. 9L, a UV blocking film 130 is formed first. Next in step C1 a deposit is made of a first intermediate film 150 on the diffusion barrier film 140 therebelow. Next, in step A the diffusion barrier film 140 is deposited onto the top surface of the first intermediate film 150. Then in step D, a test is made as to whether all of the films to be formed have been formed. If NO, then steps A and B are repeated until the answer to the test in step D is YES. The result of the test in step D will be NO until several films have been formed. If the result of the test in step D is YES, then the process of formation of the cap 20L in FIG. 8L has been completed. The diffusion barrier film 140 and the UV blocking film 130 may be composed of the materials described above.

The multiple laminated films of the cap can be deposited in a single CVD tool for efficiency of the process. Multiple film deposition of the respective cap layers in a PECVD tool cluster allows for reduced process time and tooling costs since all steps are carried out in the same process flow in the same tool cluster.

Alternatively in an equivalent solvent-based spin-on process can be employed to form the laminated films of the cap.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

What is claimed is:

1. An interconnect comprising:
    a metallic conductor having both a top surface and a lower surface;
    a cap formed on said top surface of said metallic conductor with said cap being formed of laminated films with said laminated films including:
    an Ultra-Violet (UV) blocking film;
    a diffusion barrier film comprising SiCNH in a covalently bonded tri-dimensional network with a dielectric constant of less than 6;
    said UV blocking film comprises a UV blocking high band gap film selected from the group consisting of nitrided carbon (CNx), boronitride, silicon boronitride, carbon boronitride, silicon carbon boronitride, and silicon carbon films adapted to be deposited in a Chemical Vapor Deposition (CVD) chamber, and films with lower band gap, but better mechanical, electrical, and Cu diffusion properties nitrided carbon ($CN_x$) and boron doped nitrided carbon ($CB_xN_y$); and
    the SiCNH dielectric material comprises between about 5 and about 40, atomic percent of Si; between about 5 and about 50 atomic percent of C; between 0 and about 50 atomic percent of N; and between about 10 and about 55 atomic percent of H with molecular scale voids comprising nanometer-sized pores therein between about 0.3 to about 10 nanometers in diameter; with the nanometer-sized pores occupying between about 0.5% and about 50% of material volume; and
    the films of the cap have a composite dielectric constant (k) with a value range of k less than 7 and greater than 3 (3<k<7).

2. A method of forming an interconnect comprising:
    providing a metallic conductor having both a top surface and a lower surface; and
    forming a cap on said top surface of said metallic conductor with said cap comprising laminated films with said laminated films including an Ultra-Violet (UV) blocking film and a diffusion barrier film comprising SiCNH in a covalently bonded tri-dimensional network with a dielectric constant of less than 6;

wherein the SiCNH dielectric material comprises between about 5 and about 40, atomic percent of Si; between about 5 and about 50 atomic percent of C; between 0 and about 50 atomic percent of N; and between about 10 and about 55 atomic percent of H with molecular scale voids comprising nanometer-sized pores therein between about 0.3 to about 10 nanometers in diameter; with the nanometer-sized pores occupying between about 0.5% and about 50% of material volume.

3. A method of forming an interconnect comprising:

providing a metallic conductor having both a top surface and a lower surface;

forming a cap on said top surface of said metallic conductor with said cap comprising laminated films with said laminated films including an Ultra-Violet (UV) blocking film and a diffusion barrier film comprising SiCNH in a covalently bonded tri-dimensional network with a dielectric constant of less than 6;

said adhesion film is selected from the group consisting of $Si_aL_bR_c$ and a+b+c=1; where "L" is selected from the group consisting of hydroxyl, methoxy, ethoxy, acetoxy, alkoxy, carboxy, amines, halogens; where "R" is selected from the group consisting of hydride, methyl, ethyl, vinyl, phenyl-alky, and a phenyl-aryl; where "a" ranges from about 0.25 to about 0.5, where "b" ranges from about 0.1 to about 0.8, and where "c" ranges from about 0 to about 0.7;

the SiCNH dielectric material comprises between about 5 and about 40 atomic percent of Si; between about 5 and about 50 atomic percent of C; between 0 and about 50 atomic percent of N; and between about 10 and about 55 atomic percent of H with molecular scale voids comprising nanometer-sized pores therein between about 0.3 to about 10 nanometers in diameter; with the nanometer-sized pores occupying between about 0.5% and about 50% of material volume; and the films of the cap have a composite dielectric constant (k) with a value range of k less than 7 and greater than 3 (3<k<7).

* * * * *